United States Patent
Lee et al.

(10) Patent No.: US 11,785,809 B2
(45) Date of Patent: Oct. 10, 2023

(54) DISPLAY DEVICE

(71) Applicant: Samsung Display Co., LTD., Yongin-si (KR)

(72) Inventors: Hyun Wook Lee, Suwon-si (KR); Ki Nyeng Kang, Sejong-si (KR); Basrur Veidhes, Yongin-si (KR); Sung Won Jo, Cheonan-si (KR); Jung Eun Hong, Seoul (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 231 days.

(21) Appl. No.: 17/411,612

(22) Filed: Aug. 25, 2021

(65) Prior Publication Data

US 2022/0077254 A1    Mar. 10, 2022

(30) Foreign Application Priority Data

Sep. 10, 2020  (KR) .......................... 10-2020-0115879

(51) Int. Cl.
    *H01L 25/16*     (2023.01)
    *H10K 59/122*    (2023.01)
    *H10K 59/124*    (2023.01)

(52) U.S. Cl.
    CPC ......... *H10K 59/122* (2023.02); *H10K 59/124* (2023.02)

(58) Field of Classification Search
    CPC ............... H10K 59/122; H10K 59/124; H10K 59/1201; H10K 50/813; H10K 50/822; H01L 25/167; H01L 33/62; H01L 25/0753; H01L 23/13; H01L 23/481; H01L 23/485; H01L 23/528; H01L 33/04
    See application file for complete search history.

(56) References Cited

U.S. PATENT DOCUMENTS

| 10,496,204 B2 | 12/2019 | Heo et al. |
| 2014/0159067 A1 | 6/2014 | Sakariya et al. |

(Continued)

FOREIGN PATENT DOCUMENTS

| KR | 10-2020-0042075 | 4/2020 |
| KR | 10-2020-0086790 | 7/2020 |

(Continued)

OTHER PUBLICATIONS

International Search Report corresponding to International Application No. PCT/KR2021/012340 dated Dec. 23, 2021.

(Continued)

*Primary Examiner* — Kevin Quarterman
(74) *Attorney, Agent, or Firm* — KILE PARK REED & HOUTTEMAN PLLC

(57) ABSTRACT

A display device includes an emission area and a sub-region spaced apart from the emission area in a first direction, electrodes extending in the first direction, disposed across the emission area and the sub-region, and spaced apart from each other in a second direction, a first bank surrounding the emission area and the sub-region, and light emitting elements disposed on the electrodes spaced apart in the second direction in the emission area. The first bank includes trench portions in which a top surface of the first bank is partially depressed. The trench portions are disposed between the emission area and the sub-region.

20 Claims, 21 Drawing Sheets

(56) References Cited

U.S. PATENT DOCUMENTS

| | | | |
|---|---|---|---|
| 2019/0067644 A1* | 2/2019 | Choi | H10K 50/854 |
| 2019/0165062 A1* | 5/2019 | Heo | H10K 59/124 |
| 2019/0165068 A1* | 5/2019 | Park | H10K 59/126 |
| 2019/0165326 A1* | 5/2019 | Kim | H10K 50/865 |
| 2021/0375194 A1 | 12/2021 | Kwag et al. | |
| 2021/0407970 A1 | 12/2021 | Lee et al. | |
| 2022/0102422 A1 | 3/2022 | Lee et al. | |

FOREIGN PATENT DOCUMENTS

| | | |
|---|---|---|
| KR | 10-2020-0102607 | 9/2020 |
| KR | 10-2021-0141801 | 11/2021 |
| KR | 10-2022-0002797 | 1/2022 |
| KR | 10-2022-0043993 | 4/2022 |

OTHER PUBLICATIONS

Written Opinion corresponding to International Application No. PCT/KR2021/012340 dated Dec. 23, 2021.

\* cited by examiner

TP: TP1, TP2, TP3

DISPLAY DEVICE

CROSS-REFERENCE TO RELATED APPLICATION(S)

This application claims priority to and benefits of Korean Patent Application No. 10-2020-0115879 under 35 U.S.C. § 119, filed on Sep. 10, 2020 in the Korean Intellectual Property Office, the entire contents of which are incorporated herein by reference.

BACKGROUND

1. Technical Field

This disclosure relates to a display device.

2. Description of the Related Art

The importance of display devices has increased with the development of multimedia technology. There have been developments in the types of display devices such as an organic light emitting display (OLED), a liquid crystal display (LCD) and the like.

A display device displays an image, and includes a display panel, such as an organic light emitting display panel or a liquid crystal display panel. The light emitting display panel may include light emitting elements such as light emitting diodes (LED), and examples of light emitting diodes include organic light emitting diodes which use organic materials as the light emitting material and an inorganic light emitting diodes using inorganic materials as the light emitting material.

It is to be understood that this background of the technology section is, in part, intended to provide useful background for understanding the technology. However, this background of the technology section may also include ideas, concepts, or recognitions that were not part of what was known or appreciated by those skilled in the pertinent art prior to a corresponding effective filing date of the subject matter disclosed herein.

SUMMARY

Aspects of the disclosure provide a display device capable of preventing defects such as material breakage and a short circuit in some electrodes.

However, aspects of the disclosure are not restricted to the one set forth herein. The above and other aspects of the disclosure will become more apparent to one of ordinary skill in the art to which the disclosure pertains by referencing the detailed descriptions of the embodiments given below.

The display device according to an embodiment may prevent the material of a contact electrode, which is connected to a light emitting element and an electrode, from being broken due to a stepped portion in the layer below the contact electrode. Furthermore, the display device may prevent contact electrodes from being short-circuited by residues from material used to form the contact electrodes.

It should be noted that the effects of the disclosure are not limited to those described above, and other effects of the disclosure will be apparent from the following description.

According to an embodiment, a display device may include an emission area and a sub-region spaced apart from the emission area in a first direction, electrodes extending in the first direction, disposed across the emission area and the sub-region, and spaced apart from each other in a second direction, a first bank surrounding the emission area and the sub-region, and light emitting elements disposed on the electrodes spaced apart in the second direction in the emission area. The first bank may include trench portions in which a top surface of the first bank is partially depressed. The trench portions may be located between the emission area and the sub-region.

The display device may further include contact electrodes disposed on the electrodes and extending in the first direction. The contact electrodes may be disposed across the emission area and the sub-region through the trench portions of the first bank.

The first bank may include a first bank portion, a second bank portion that may include the trench portions and may have a height lower than a height of the first bank portion, and a bridge bank portion that may be disposed between the trench portions and may have a same height as the height of the first bank portion.

The display device may further include a first insulating layer covering the electrodes. The first insulating layer may include contact portions that may partially expose top surfaces of the electrodes in the sub-region.

The contact electrodes may electrically contact the light emitting elements disposed in the emission area and the electrodes exposed through the contact portions in the sub-region.

The display device may further comprise a second insulating layer disposed on the first insulating layer, the first bank, and the light emitting elements. The second insulating layer may expose ends of the light emitting elements. The second insulating layer may be not disposed in the trench portions of the first bank.

The contact electrodes may be disposed on the second insulating layer, and may be directly disposed on the second bank portion in the trench portions.

Each of the trench portions of the first bank may have a sidewall aligned with a sidewall of the second insulating layer disposed on the first bank.

The second insulating layer may include openings adjacent to the trench portions in the emission area and exposing a top surface of the first insulating layer. The contact electrodes may be directly disposed on the first insulating layer in the openings.

The display device may further include a third insulating layer disposed on at least one of the contact electrodes and the second insulating layer. At least a portion of the contact electrodes may be directly disposed on the third insulating layer in the second bank portion.

At least a portion of the contact electrodes may be disposed between the first bank and the third insulating layer in the trench portions.

The electrodes may include a first electrode and a second electrode spaced apart from the first electrode in the second direction. The display device may further include a first contact electrode disposed on the first electrode and extending in the first direction, and a second contact electrode disposed on the second electrode and extending in the first direction. The trench portions may include a first trench portion in which the first contact electrode may be disposed, and a second trench portion in which the second contact electrode may be disposed. The second trench portion may be spaced apart from the first trench portion in the second direction.

The electrodes may further include a third electrode spaced apart from the second electrode in the second direction. The first electrode may be disposed between the second electrode and the third electrode. The light emitting elements may include a first light emitting element that may have a first end disposed on the first electrode and a second end disposed on the third electrode, and a second light emitting element that may have a first end disposed on the first electrode and a second end disposed on the second electrode.

The display device may further include a third contact electrode including a first extension portion that may be disposed on the third electrode and may electrically contact the second end of the first light emitting element, a second extension portion that may be disposed on the first electrode and may electrically contact the first end of the second light emitting element, and a connection portion that may connect the first extension portion to the second extension portion. The first extension portion may extend in the first direction and may be disposed across the emission area and the sub-region through the first trench portion.

The trench portions may further include a third trench portion located opposite the first trench portion in the first direction with respect to the emission area, and the connection portion may be disposed on the third trench portion.

According to an embodiment, a display device may include an emission area and a sub-region spaced apart from the emission area in a first direction, holes disposed between the emission area and the sub-region, electrodes extending in the first direction, disposed across the emission area and the sub-region, and spaced apart from each other in a second direction, a first bank surrounding the emission area and the sub-region and including a bridge bank portion disposed between the holes, light emitting elements disposed on the electrodes and spaced apart in the second direction in the emission area, and contact electrodes disposed on the electrodes and extending in the first direction. The plurality of holes may connect the emission area to the sub-region, and the contact electrodes may be disposed across the emission area and the sub-region through the holes.

The display device may further include a first insulating layer covering the electrodes, and a second insulating layer disposed on the first insulating layer, the first bank, and the light emitting elements to expose ends of the light emitting elements. The second insulating layer may be not disposed in the holes.

The contact electrodes may be disposed on the second insulating layer that electrically contacts the light emitting elements, and may be directly disposed on the first insulating layer in the holes.

The first insulating layer may include contact portions formed in the sub-region to partially expose top surfaces of the electrodes, and the contact electrodes may electrically contact the electrodes in the contact portions of the sub-region.

A sidewall of the first bank around the holes may be aligned with a sidewall of the second insulating layer disposed on the first bank.

BRIEF DESCRIPTION OF THE DRAWINGS

The above and other aspects and features of the disclosure will become more apparent by describing in detail embodiments thereof with reference to the attached drawings, in which.

DETAILED DESCRIPTION OF THE EMBODIMENTS

Figure 1:
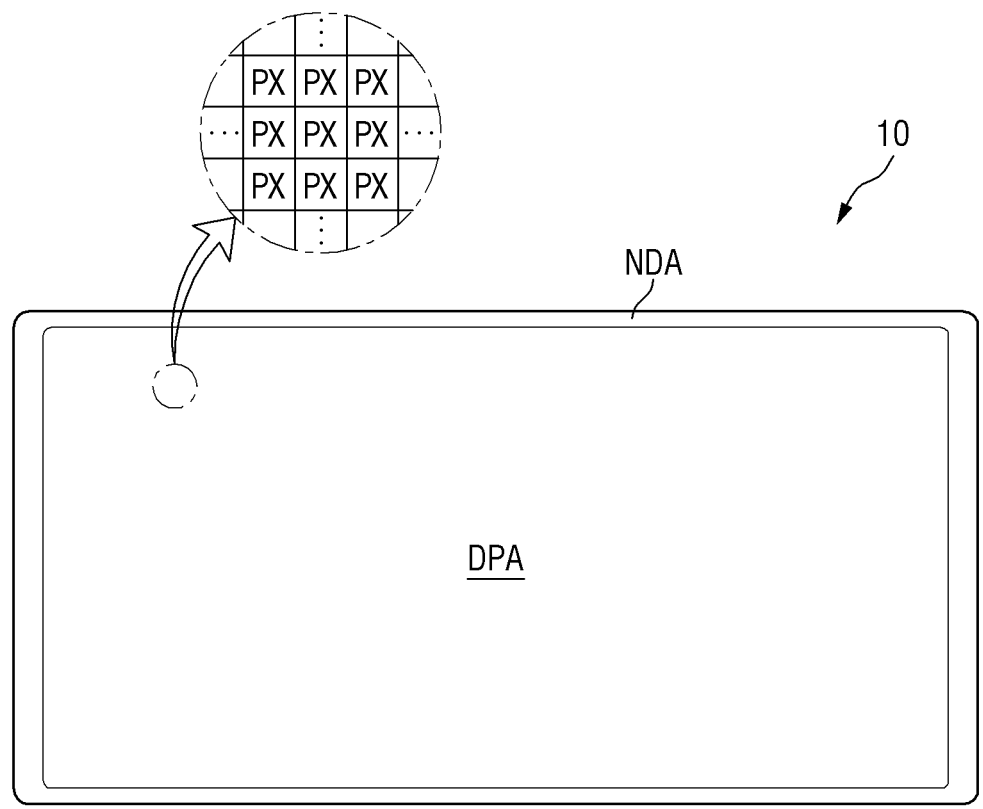
FIG. 1 is a schematic plan view of a display device according to an embodiment.

The disclosure will now be described more fully hereinafter with reference to the accompanying drawings, in which embodiments are shown. This disclosure may, however, be embodied in different forms and should not be construed as limited to the embodiments set forth herein. Rather, these embodiments are provided so that this disclosure will be thorough and complete, and will fully convey the scope of the invention to those skilled in the art.

It will also be understood that when a layer is referred to as being "on" another layer or substrate, it can be directly on the other layer or substrate, or intervening layers may also be present. The same reference numbers indicate the same components throughout the specification.

It will be understood that, although the terms "first," "second," etc. may be used herein to describe various elements, these elements should not be limited by these terms. These terms are only used to distinguish one element from another element. For instance, a first element discussed below could be termed a second element without departing from the teachings of the disclosure. Similarly, the second element could also be termed the first element.

In the drawings, sizes, thicknesses, ratios, and dimensions of the elements may be exaggerated for ease of description and for clarity. Like numbers refer to like elements throughout.

In the specification and the claims, the phrase "at least one of" is intended to include the meaning of "at least one selected from the group of" for the purpose of its meaning and interpretation. For example, "at least one of A and B" may be understood to mean "A, B, or A and B."

The spatially relative terms "below", "beneath", "lower", "above", "upper", or the like, may be used herein for ease of description to describe the relations between one element or component and another element or component as illustrated in the drawings. It will be understood that the spatially relative terms are intended to encompass different orientations of the device in use or operation, in addition to the orientation depicted in the drawings. For example, in the case where a device illustrated in the drawing is turned over, the device positioned "below" or "beneath" another device may be placed "above" another device. Accordingly, the illustrative term "below" may include both the lower and upper positions. The device may also be oriented in other directions and thus the spatially relative terms may be interpreted differently depending on the orientations.

The phrase "in a plan view" means viewing the object from the top, and the phrase "in a schematic cross-sectional view" means viewing a cross-section of which the object is vertically cut from the side.

The terms "overlap" or "overlapped" mean that a first object may be above or below or to a side of a second object, and vice versa. Additionally, the term "overlap" may include layer, stack, face or facing, extending over, covering, or partly covering or any other suitable term as would be appreciated and understood by those of ordinary skill in the art.

The terms "comprises," "comprising," "includes," and/or "including,", "has," "have," and/or "having," and variations thereof when used in this specification, specify the presence of stated features, integers, steps, operations, elements, components, and/or groups thereof, but do not preclude the presence or addition of one or more other features, integers, steps, operations, elements, components, and/or groups thereof.

It will be understood that when an element (or a region, a layer, a portion, or the like) is referred to as "being on", "connected to" or "coupled to" another element in the specification, it can be directly disposed on, connected, or coupled to another element mentioned above, or intervening elements may be disposed therebetween.

It will be understood that the terms "connected to" or "coupled to" may include a physical or electrical connection or coupling.

Unless otherwise defined, all terms (including technical and scientific terms) used herein have the same meaning as commonly understood by one of ordinary skill in the art to which the disclosure pertains. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, embodiments will be described with reference to the accompanying drawings.

FIG. 1 is a schematic plan view of a display device according to an embodiment.

Referring to FIG. 1, a display device 10 may display a moving image or a still image. The display device 10 may refer to any electronic device providing a display screen. Examples of the display device 10 may include a television, a laptop computer, a monitor, a billboard, an Internet-of-Things device, a mobile phone, a smartphone, a tablet personal computer (PC), an electronic watch, a smart watch, a watch phone, a head-mounted display, a mobile communication terminal, an electronic notebook, an electronic book, a portable multimedia player (PMP), a navigation device, a game machine, a digital camera, a camcorder, and the like, which provide a display screen.

The display device 10 may include a display panel which provides a display screen. Examples of the display panel may include an inorganic light emitting diode display panel, an organic light emitting display panel, a quantum dot light emitting display panel, a plasma display panel, and a field emission display panel. In the following description, an inorganic light emitting diode display panel is illustrated as a display panel, but the embodiments are not limited thereto, and other display panels may be applied within the scope of the embodiments.

The shape of the display device 10 may be variously modified. For example, the display device 10 may have a shape such as a rectangular shape elongated in a horizontal direction, a rectangular shape elongated in a vertical direction, a square shape, a quadrilateral shape with rounded corners (vertices), another polygonal shape and a circular shape. The shape of a display area DPA of the display device 10 may also be similar to the overall shape of the display device 10. FIG. 1 illustrates a display device 10 having a rectangular shape elongated in a second direction DR2.

The display device 10 may include the display area DPA and a non-display area NDA. The display area DPA is an area where a screen can be displayed, and the non-display area NDA is an area where a screen is not displayed. The display area DPA may also be referred to as an active region, and the non-display area NDA may also be referred to as a non-active region. The display area DPA may substantially occupy the center of the display device 10.

The display area DPA may include pixels PX. The pixels PX may be arranged in a matrix. The shape of each pixel PX may be a rectangular or square shape in a plan view. However, the embodiments are not limited thereto, and it may be a rhombic shape in which each side is inclined with respect to a direction. The pixels PX may be alternately disposed in a stripe type or a PENTILE™ type. Each of the pixels PX may include one or more light emitting elements that emit light of a specific wavelength band to display a specific color.

The non-display area NDA may be disposed around the display area DPA. The non-display area NDA may completely or partially surround the display area DPA. The display area DPA may have a rectangular shape, and the non-display area NDA may be disposed adjacent to four sides of the display area DPA. The non-display area NDA may form a bezel of the display device 10. Wirings or circuit drivers included in the display device 10 may be disposed in the non-display area NDA, or external devices may be mounted thereon.

Figure 2:
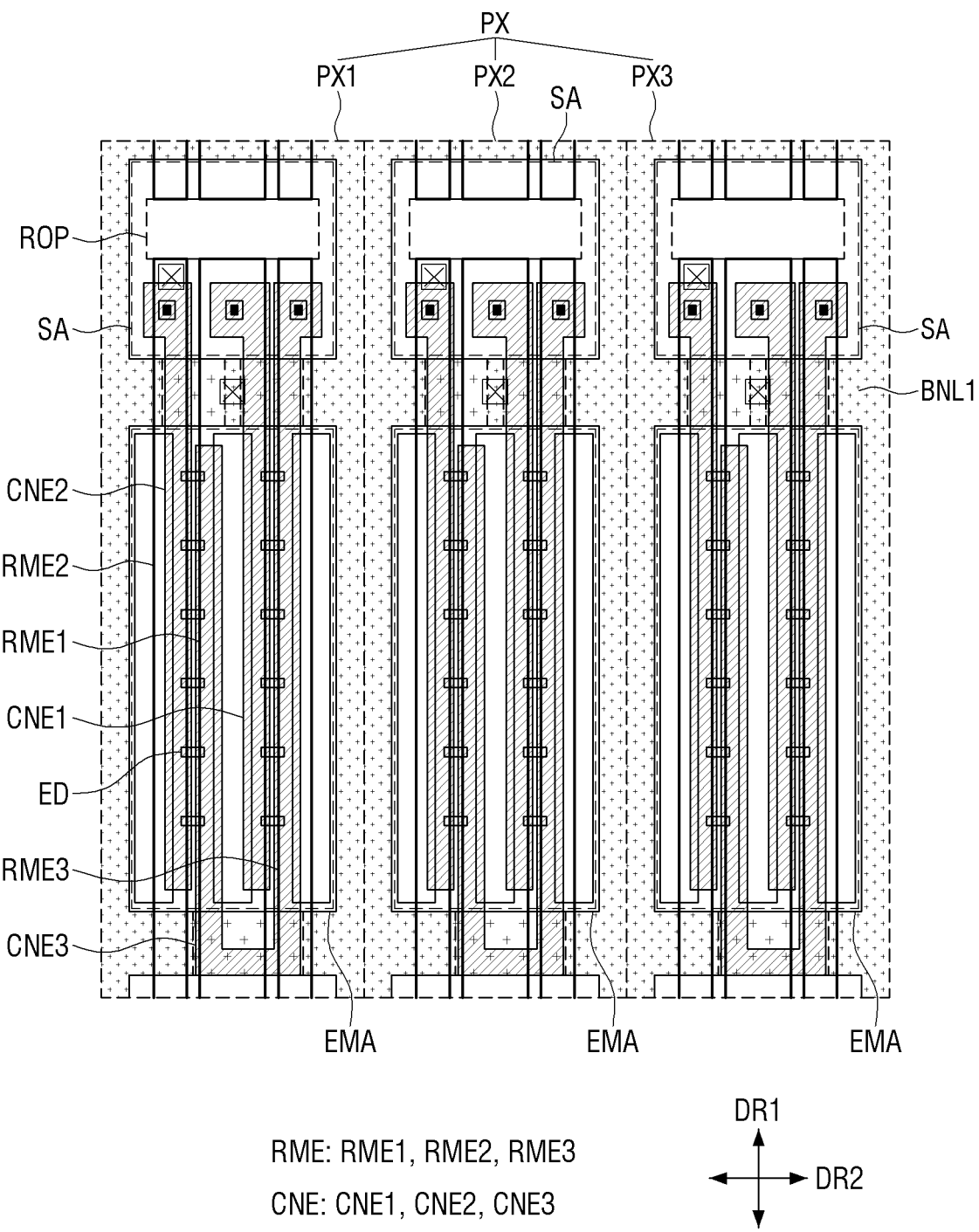
FIG. 2 is a schematic plan view illustrating a pixel of a display device according to an embodiment.

FIG. 2 is a schematic plan view illustrating a pixel of a display device according to an embodiment.

Referring to FIG. 2, each of the pixels PX of the display device 10 may include sub-pixels PXn (n ranging from 1 to 3). For example, a pixel PX may include a first sub-pixel PX1, a second sub-pixel PX2 and a third sub-pixel PX3. The first sub-pixel PX1 may emit light of a first color, the second sub-pixel PX2 may emit light of a second color, and the third sub-pixel PX3 may emit light of a third color. For example, the first color may be blue, the second color may be green, and the third color may be red. However, the embodiments are not limited thereto, and the sub-pixels PXn may emit light of the same color. Although FIG. 2 illustrates that a pixel PX includes three sub-pixels PXn, the embodiments are not limited thereto, and the pixel PX may include a larger number of sub-pixels PXn.

Each sub-pixel PXn of the display device 10 may include an emission area EMA and a non-emission area (not shown). The emission area EMA may be an area where the light emitting elements ED are aligned to emit light of a certain wavelength band. The non-emission area may be an area where there are no light emitting elements ED and the light emitted from the light emitting elements ED do not reach, so that no light is emitted. The emission area may include an area in which the light emitting element ED is disposed, and an area adjacent to the light emitting element ED to emit light emitted from the light emitting element ED.

Without being limited thereto, the emission area may also include an area in which the light emitted from the light emitting elements ED is reflected or refracted by another member and emitted. The light emitting elements ED may be disposed in each sub-pixel PXn, and the emission area may be formed to include an area where the light emitting elements ED are disposed and an area adjacent thereto.

Although it is shown in the drawing that the sub-pixels PXn have the emission areas EMA that are substantially identical in size, the embodiments are not limited thereto. In some embodiments, the emission areas EMA of the sub-pixels PXn may have different sizes according to a color or wavelength band of light emitted from the light emitting element ED disposed in each sub-pixel.

Each sub-pixel PXn may further include a sub-region SA disposed in the non-emission area. The sub-region SA may be disposed at a side of the emission area EMA in the first direction DR1, and may be disposed between the emission areas EMA of the sub-pixels PXn adjacent in the first direction DR1. For example, the emission areas EMA and the sub-regions SA may be repeatedly arranged in the second direction DR2, respectively, while being alternately arranged in the first direction DR1. A first bank BNL1 may be disposed between the sub-region SA and the emission area EMA, and the gap therebetween may vary according to the width of the first bank BNL1. Light may not be emitted from the sub-region SA because the light emitting element ED is not disposed in the sub-region SA, but an electrode RME disposed in each sub-pixel PXn may be partially disposed in the sub-region SA. The electrodes RME disposed in some of the sub-pixels PXn may be separated in the sub-region SA.

The first bank BNL1 may include a portion extending in the first direction DR1 and the second direction DR2 in a plan view to be arranged in a grid pattern over the entire surface of the display area DPA. The first bank BNL1 may be disposed along the boundaries between the sub-pixels PXn to delimit the neighboring sub-pixels PXn. Furthermore, the first bank BNL1 may be disposed to surround the emission area EMA and the sub-region SA disposed for each sub-pixel PXn to delimit them from each other.

According to an embodiment, in the display device 10, the first bank BNL1 may delimit the adjacent sub-pixels PXn from each other and surround the emission area EMA and the sub-region SA. The first bank BNL1 may include trench portions TP disposed between the emission area EMA and the sub-region SA. The first bank BNL1 may include the trench portion TP having a height lower than the portion of the first bank BNL1 at the boundary between the sub-pixels PXn, so that a height difference caused by the first bank BNL1 can be decreased between the emission area EMA and the sub-region SA.

Figure 3:
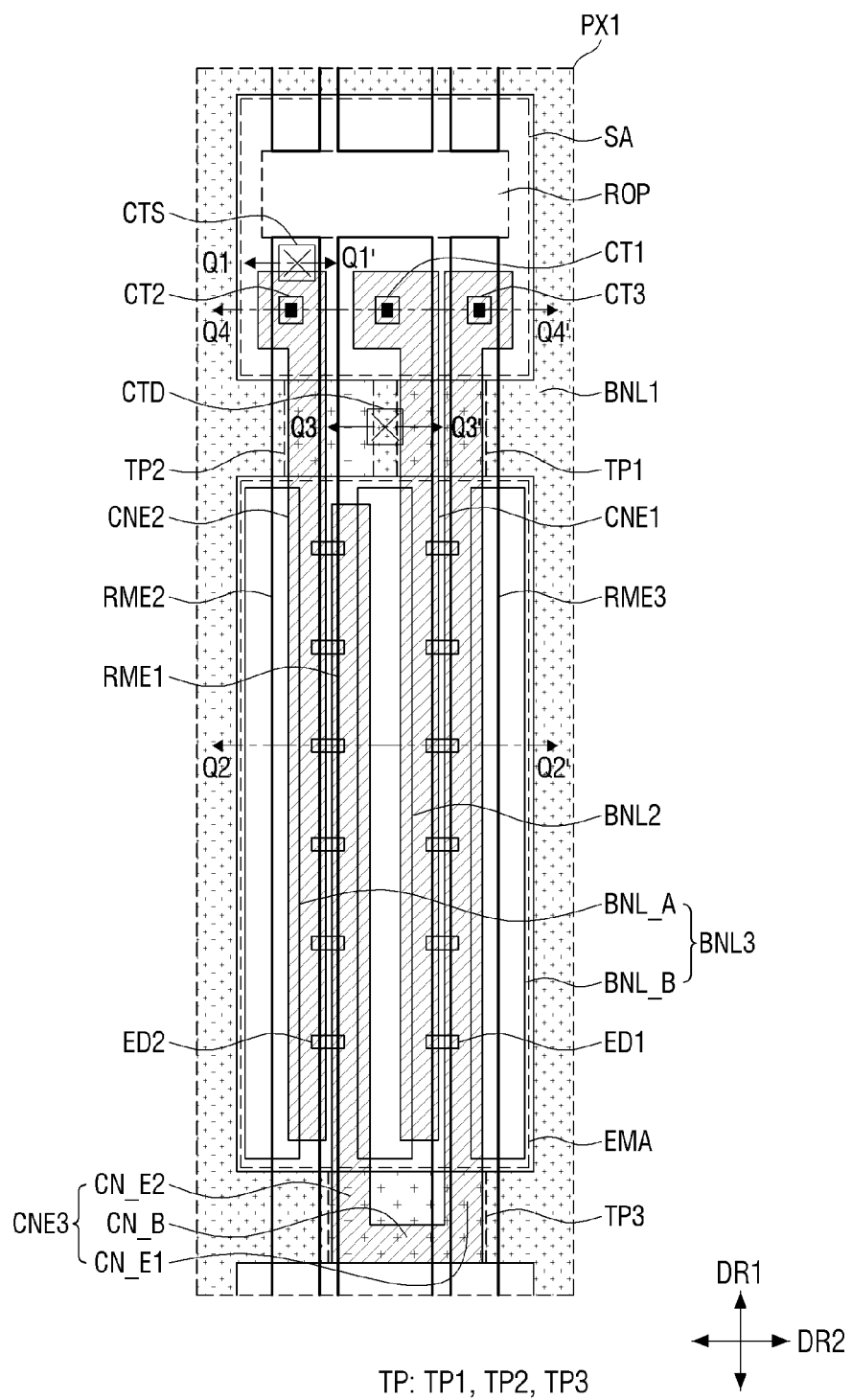
FIG. 3 is a schematic plan view illustrating a first sub-pixel of FIG. 2.
Figure 4:
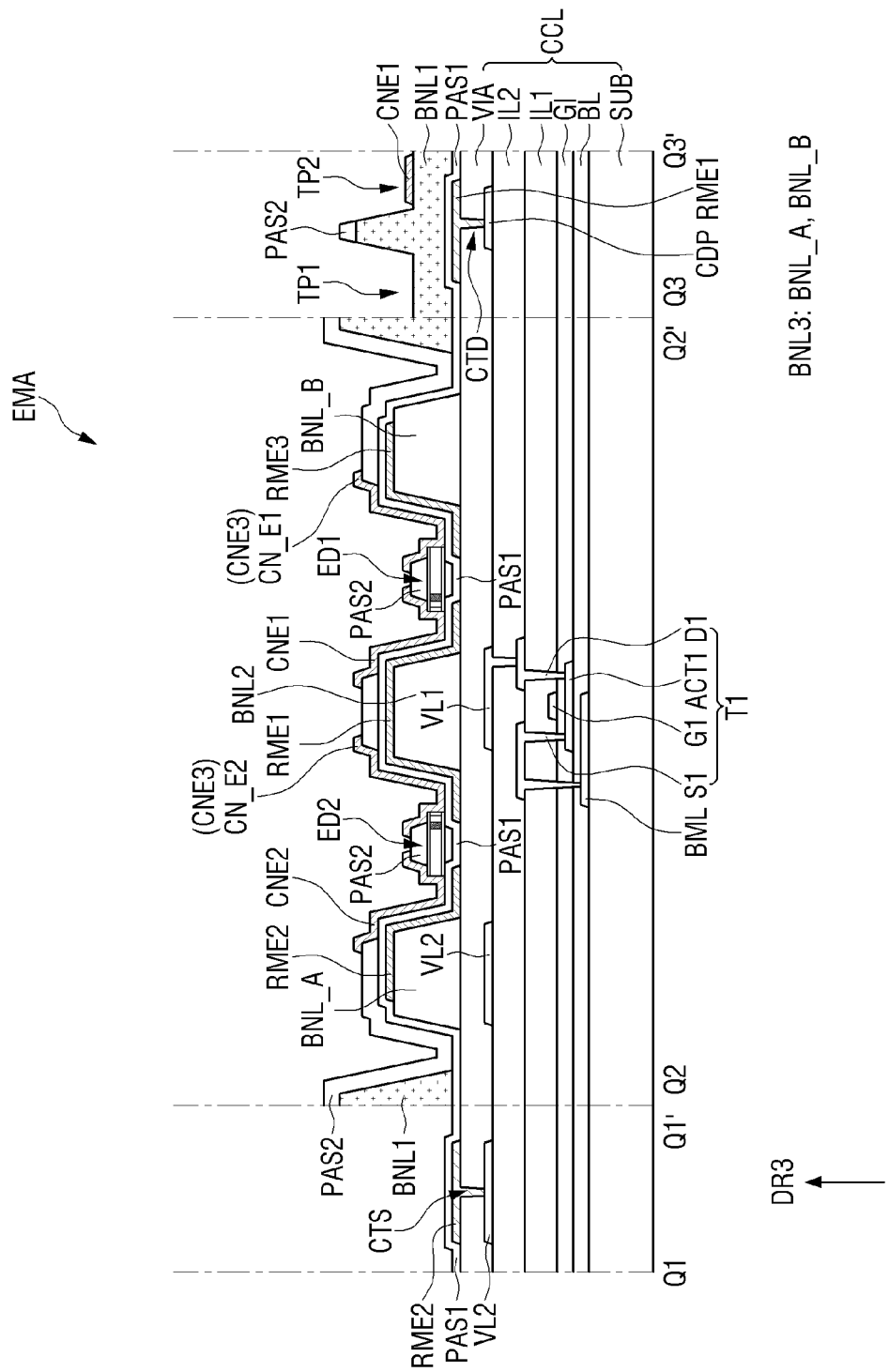
FIG. 4 is a schematic cross-sectional view taken along lines Q1-Q1', Q2-Q2', and Q3-Q3' of FIG. 3.
Figure 5:
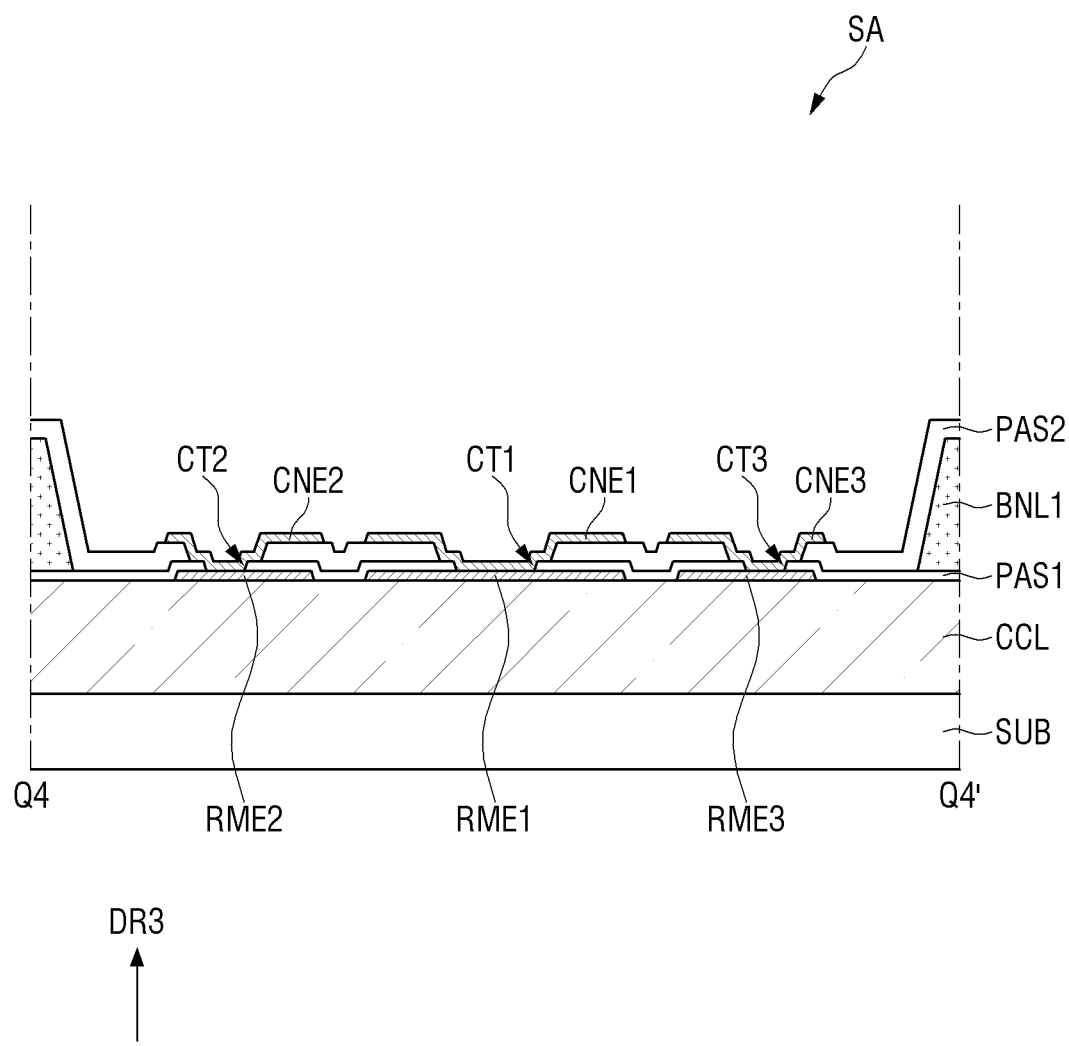
FIG. 5 is a schematic cross-sectional view taken along line Q4-Q4' of FIG. 3.

FIG. 3 is a schematic plan view illustrating a first sub-pixel of FIG. 2. FIG. 4 is a schematic cross-sectional view taken along lines Q1-Q1', Q2-Q2', and Q3-Q3' of FIG. 3. FIG. 5 is a schematic cross-sectional view taken along line Q4-Q4' of FIG. 3. FIG. 3 illustrates a first sub-pixel PX1 included in a pixel PX, and FIG. 4 illustrates a cross-section through both ends of the light emitting elements ED disposed in the first sub-pixel PX1. FIG. 5 illustrates a cross-section of contact portions CT1, CT2, and CT3 to which the electrodes RME and contact electrodes CNE are connected.

Referring to FIGS. 3 to 5 in conjunction with FIG. 2, the display device 10 may include a first substrate SUB and a semiconductor layer, conductive layers, and insulating layers disposed on the first substrate SUB. The semiconductor layer, the conductive layers, and the insulating layers may each constitute a circuit layer CCL and a display element layer of the display device 10.

The first substrate SUB may be an insulating substrate. The first substrate SUB may be made of an insulating material such as glass, quartz, or polymer resin. The first substrate SUB may be a rigid substrate, but may also be a flexible substrate which can be bent, folded, or rolled.

A first conductive layer may be disposed on the first substrate SUB. The first conductive layer includes a lower metal layer BML that is disposed to overlap an active layer ACT1 of a first transistor T1. The lower metal layer BML may include a material of blocking light to prevent light from reaching the active layer ACT1 of the first transistor T1. However, the lower metal layer BML may be omitted.

The buffer layer BL may be entirely disposed on the lower metal layer BML and the first substrate SUB. The buffer layer BL may be formed on the first substrate SUB to protect the transistors of the pixel PX from moisture permeating through the first substrate SUB susceptible to moisture permeation, and may perform a surface planarization function.

The semiconductor layer is disposed on the buffer layer BL. The semiconductor layer may include the active layer ACT1 of the first transistor T1. This may be disposed to partially overlap a gate electrode G1 of a second conductive layer, which will be described below.

The semiconductor layer may include polycrystalline silicon, monocrystalline silicon, oxide semiconductor, and the like. In an embodiment, the semiconductor layer may include polycrystalline silicon. The oxide semiconductor may be an oxide semiconductor containing indium (In). For example, the oxide semiconductor may be at least one of indium tin oxide (ITO), indium zinc oxide (IZO), indium gallium oxide (IGO), indium zinc tin oxide (IZTO), indium gallium tin oxide (IGTO), indium gallium zinc oxide (IGZO), and indium gallium zinc tin oxide (IGZTO).

In the drawing, only the first transistor T1 is illustrated among the transistors included in the sub-pixel PXn of the display device 10, but the embodiments are not limited thereto, and the display device 10 may include a larger number of transistors.

The first gate insulating layer GI may be disposed on the semiconductor layer and the buffer layer BL. The first gate insulating layer GI may function as a gate insulating layer of each transistor.

The second conductive layer may be disposed on the first gate insulating layer GI. The second conductive layer may include the gate electrode G1 of the first transistor T1. The gate electrode G1 may be arranged to overlap the channel region of the active layer ACT1 in the third direction DR3 which is the thickness direction. Although not shown in the drawing, the second conductive layer may further include a capacitance electrode of a storage capacitor.

A first interlayer insulating layer IL1 may be disposed on the second conductive layer. The first interlayer insulating layer IL1 may function as an insulating layer between the second conductive layer and other layers disposed thereon, and may protect the second conductive layer.

A third conductive layer may be disposed on the first interlayer insulating layer ILL The third conductive layer may include a first source electrode Si and a first drain electrode D1 of the first transistor T1.

The first source electrode Si and the first drain electrode D1 of the first transistor T1 may each electrically contact the active layer ACT1 through a contact hole penetrating the first interlayer insulating layer IL1 and the first gate insulating layer GI. Furthermore, the first source electrode Si may be in electrical contact with the lower metal layer BML through another contact hole. Although not shown in the drawing, the third conductive layer may further include data lines or a capacitance electrode of a storage capacitor.

A second interlayer insulating layer IL2 may be disposed on the third conductive layer. The second interlayer insulating layer IL2 may function as an insulating layer between the third conductive layer and other layers disposed thereon, and may protect the third conductive layer.

A fourth conductive layer may be disposed on the second interlayer insulating layer IL2. The fourth conductive layer may include a first voltage line VL1, a second voltage line VL2, and a first conductive pattern CDP. A high potential voltage (or a first source voltage) may be applied to the first voltage line VL1 and supplied to the first transistor T1, and a low potential voltage (or a second source voltage) may be applied to the second voltage line VL2 and supplied to a second electrode RME2.

The first conductive pattern CDP may be electrically connected to the first transistor T1. The first conductive pattern CDP may also be in electrical contact with a first electrode RME1, which will be described below, and the first transistor T1 may transfer the first source voltage applied from the first voltage line VL1 to the first electrode RME1.

The buffer layer BL, the first gate insulating layer GI, the first interlayer insulating layer ILL and the second interlayer insulating layer IL2 described above may be formed of inorganic layers stacked in an alternating manner. For example, the buffer layer BL, the first gate insulating layer GI, the first interlayer insulating layer ILL and the second interlayer insulating layer IL2 may be formed as a double layer formed by stacking, or a multilayer formed by alternately stacking, inorganic layers including at least one of silicon oxide (SiOx), silicon nitride (SiNx), and silicon oxynitride (SiOxNy). However, the embodiments are not limited thereto, and the buffer layer BL, the first gate insulating layer GI, the first interlayer insulating layer ILL and the second interlayer insulating layer IL2 may be formed as a single inorganic layer containing the insulating material described above.

Each of the second conductive layer, the third conductive layer, and the fourth conductive layer may be formed as a single layer or multiple layers made of at least one of molybdenum (Mo), aluminum (Al), chromium (Cr), gold (Au), titanium (Ti), nickel (Ni), neodymium (Nd), and copper (Cu), or an alloy thereof. However, the embodiments are not limited thereto.

A via layer VIA is disposed on the fourth conductive layer. The via layer VIA may include an organic insulating material, for example, an organic material such as polyimide (PI), to perform a surface planarization function.

As the display element layer, banks BNL1, BNL2, and BNL3, the electrodes RME, the light emitting elements ED, and the contact electrodes CNE may be disposed on the via layer VIA. Furthermore, insulating layers PAS1 and PAS2 may be disposed on the via layer VIA.

The second bank BNL2 may be disposed directly on the via layer VIA. The second bank BNL2 may be arranged to extend in the first direction DR1 from the center of the emission area EMA. The third banks BNL3 may be disposed directly on the via layer VIA, and may be disposed to be spaced apart from each other in the emission area EMA of the sub-pixel PXn. For example, the third bank BNL3 may include sub-banks BNL_A and BNL_B that are spaced apart from each other in the second direction DR2 with the second bank BNL2 interposed therebetween, in each emission area EMA. The first sub-bank BNL_A may be disposed at the left side of the second bank BNL2, and the second sub-bank BNL_B may be disposed at the right side thereof. The second bank BNL2 and the third bank BNL3 may have a shape extending in the first direction DR1, and may have a length smaller than the length of the area surrounded by the first bank BNL1 in the first direction DR1. The second bank BNL2 and the third bank BNL3 may be arranged in the emission area EMA of each sub-pixel PXn, and may form island-like patterns that have relatively narrow widths and extend in a direction in the entire surface of the display area DPA. It is illustrated in the drawing that the second bank BNL2 and the sub-banks BNL_A and BNL_B of the third bank BNL3 have the same width, but the embodiments are not limited thereto. The second bank BNL2 may have a greater width than the third bank BNL3.

At least a portion of each of the second bank BNL2 and the third bank BNL3 may protrude from the top surface of the via layer VIA. The protruding portions of the second bank BNL2 and the third bank BNL3 may have inclined side surfaces, and light emitted from the light emitting element ED may be reflected from the electrodes RME disposed on the second bank BNL2 and the third bank BNL3 to be emitted in an upward direction of the via layer VIA. However, the embodiments are not limited thereto, and the second bank BNL2 and the third bank BNL3 may have a semicircular shape or a semi-elliptical shape, the outer surface of which is curved. The second bank BNL2 and the third bank BNL3 may include an organic insulating material such as polyimide (PI), but the embodiments are not limited thereto.

The electrodes RME are disposed for each sub-pixel PXn in a shape extending in a direction. For example, the electrodes RME may have a shape extending in the first direction DR1 and may be disposed to be spaced apart from each other in the second direction DR2 in each sub-pixel PXn. The electrodes RME of the display device 10 may include electrodes connected directly to the fourth conductive layer under the via layer VIA through electrode contact holes CTD and CTS penetrating the via layer VIA. In other embodiments, the display device 10 may further include electrodes that are not directly connected to the fourth conductive layer.

For example, a sub-pixel PXn may include the plurality of electrodes RME disposed to extend in the first direction DR1 across the emission area EMA and the sub-region SA. The electrodes RME of the sub-pixel PXn adjacent in the first direction DR1 may be separated from each other at a separating portion ROP of the sub-region SA. In the fabricating process of the display device 10, the electrodes RME may be formed as electrode lines extending in the first direction DR1, and may be used to generate an electric field in the sub-pixel PXn to align the light emitting elements ED. The light emitting elements ED may be aligned by a dielectrophoretic force that is induced by the electric field generated on the electrode lines, and the electrode lines may be separated at the separating portion ROP to form the electrodes RME.

The electrodes RME disposed in each sub-pixel PXn may include the first electrode RME1, the second electrode RME2, and a third electrode RME3. The first electrode RME1 may be disposed on the second bank BNL2, and the second electrode RME2 and the third electrode RME3 may be respectively disposed on the sub-banks BNL_A and BNL_B of the third bank BNL3.

The first electrode RME1 may be disposed on the second bank BNL2 in the center portion of the emission area EMA. The second electrode RME2 may be spaced apart from the first electrode RME1 in the second direction DR2, and may be disposed on the first sub-bank BNL_A at the left side of the emission area EMA. The third electrode RME3 may be spaced apart from the second electrode RME2 in the second direction DR2 with the first electrode RME1 interposed therebetween, and may be disposed on the second sub-bank BNL_B at the right side of the emission area EMA. Both sides of the first electrode RME1 may respectively face the second electrode RME2 and the third electrode RME3, while being spaced apart therefrom.

Each of the first electrode RME1 and the second electrode RME2 may be a first type electrode that is connected to the fourth conductive layer disposed thereunder. The first electrode RME1 and second electrode RME2 may be directly connected to the fourth conductive layer through the first electrode contact hole CTD formed in a portion overlapping the first bank BNL1 and the second electrode contact hole CTS formed in the sub-region SA, respectively. For example, the first electrode RME1 may be in contact with the first conductive pattern CDP through the first electrode contact hole CTD penetrating the via layer VIA thereunder. The second electrode RME2 may be in contact with the second voltage line VL2 through the second electrode contact hole CTS penetrating the via layer VIA thereunder. The first electrode RME1 may be electrically connected to the first transistor T1 through the first conductive pattern CDP, so that the first source voltage may be applied to the first electrode RME1, and the second electrode RME2 may be electrically connected to the second voltage line VL2, so that the second source voltage may be applied to the second electrode RME2. Since the first electrode RME1 and the second electrode RME2 are disposed for each sub-pixel PXn separately, the light emitting elements ED of different sub-pixels PXn may emit light individually.

The third electrode RME3 may be a second type electrode that is not directly connected to the fourth conductive layer disposed thereunder, unlike the first type electrode. The electrical signal directly applied to the first type electrode may be transmitted to the second type electrode through the light emitting element ED or the contact electrode CNE. Although the third electrode RME3 may not be directly connected to the fourth conductive layer disposed thereunder, it may not be floated because the electrical signal applied from the fourth conductive layer is transmitted thereto.

In an embodiment, among the electrodes RME, the width of the first electrode RME1 measured in the second direction DR2 may be greater than the second bank BNL2, and the widths of the second electrode RME2 and the third electrode RM3 measured in the second direction DR2 may be smaller than the third bank BNL3. The first electrode RME1 may be arranged to cover (or overlap) both side surfaces of the second bank BNL2, and each of the second and third electrodes RME2 and RME3 may be arranged to cover (or overlap) a side surface of the third bank BNL3. The electrodes RME may be disposed to cover (or overlap) at least one side surface of the second bank BNL2 or the third bank BNL3 to reflect light emitted from the light emitting element ED. The gap between the electrodes RME in the second direction DR2 may be smaller than the gap between the second bank BNL2 and the third bank BNL3. Each of the electrodes RME may have at least a portion directly disposed on the via layer VIA, so that they may be disposed on the same plane.

The electrodes RME may be electrically connected to the light emitting elements ED. The electrodes RME may be connected to both ends of the light emitting element ED through the contact electrodes CNE, and may transmit an electrical signal applied from the fourth conductive layer to the light emitting element ED. Electrical signals for emitting the light emitting elements ED may be directly applied to the first electrode RME1 and the second electrode RME2, and the electrical signals may be transmitted to the other electrodes through the contact electrodes CNE and light emitting elements ED, which will be described below.

Each of the electrodes RME may include a conductive material having high reflectivity. For example, the electrode RME may include a metal such as silver (Ag), copper (Cu), or aluminum (Al) as a material having high reflectivity, or may be an alloy including aluminum (Al), nickel (Ni), lanthanum (La), and the like. The electrode RME may reflect, in the upward direction of each sub-pixel PXn, light emitted from the light emitting element ED and traveling to the side surface of the first bank BNL1 or the second bank BNL2.

However, the embodiments are not limited thereto, and each electrode RME may further include a transparent conductive material. For example, each electrode RME may include a material such as ITO, IZO, and ITZO. In some embodiments, each of the electrodes RME may have a structure in which at least one transparent conductive material and at least one metal layer having high reflectivity are stacked, or may be formed as a single layer including them. For example, each electrode RME may have a stacked structure of ITO/Ag/ITO, ITO/Ag/IZO, ITO/Ag/ITZO/IZO, or the like.

The first insulating layer PAS1 is disposed on the electrodes RME, the second bank BNL2 and the third bank BNL3. The first insulating layer PAS1 may be disposed to entirely cover them. The first insulating layer PAS may protect the electrodes RME, while insulating them from each other. The first insulating layer PAS1 may prevent the light emitting element ED disposed thereon from being damaged by direct contact with other members.

In an embodiment, the first insulating layer PAS1 may have stepped portions such that the top surface thereof is partially depressed between the electrodes RME spaced apart in the second direction DR2. The light emitting element ED may be disposed on the top surface of the first insulating layer PAS1, where the stepped portions are formed, and thus a space may remain between the light emitting element ED and the first insulating layer PAS1. However, the embodiments are not limited thereto.

The first insulating layer PAS1 may include a contact portions CT1, CT2, and CT3 that expose a portion of the top surface of each electrode RME. The contact portions CT1, CT2, and CT3 may penetrate the first insulating layer PAS1, and the contact electrodes CNE, which will be described below, may be in contact with the exposed electrodes RME through the contact portions CT1, CT2, and CT3.

The first bank BNL1 may be disposed on the first insulating layer PAS1. The first bank BNL1 may include portions extending in the first direction DR1 and the second direction DR2 in a plan view, and thus may be arranged in a grid pattern. The first bank BNL1 may be disposed along the boundaries between the sub-pixels PXn to delimit the neighboring sub-pixels PXn. Furthermore, the first bank BNL1 may be disposed to surround the emission area EMA and the sub-region SA disposed for each sub-pixel PXn to delimit them from each other.

In an embodiment, in the portion of the first bank BNL1 extending in the first direction DR1, the portion disposed between the emission areas EMA may have a greater width than the portion disposed between the sub-regions SA, and the gap between the sub-regions SA may be smaller than the gap between the emission areas EMA. However, the embodiments are not limited thereto, and vice versa. The width of the first bank BNL1 may be varied so that the gap between the sub-regions SA may be greater than the gap between the emission areas EMA.

The first bank BNL1 may have a height greater than those of the second bank BNL2 and the third bank BNL3. The first bank BNL1 may prevent ink from overflowing to the adjacent sub-pixel PXn in an inkjet printing step during the fabricating process of the display device 10. The first bank BNL1 may separate inks in which different light emitting elements ED are dispersed for different sub-pixels PXn so as not to be mixed with each other. However, the embodiments are not limited thereto. The first bank BNL1, the second bank BNL2, and the third bank BNL3 may include the same material, and may be formed to have substantially similar heights.

The light emitting element ED may be disposed on the first insulating layer PAS1. The light emitting elements ED may be disposed to be spaced apart from each other along the first direction DR1 in which the electrodes RME extend, and may be aligned substantially parallel to each other. The light emitting element ED may have a shape extending in one direction, and the extension direction of the light emitting element ED may be substantially perpendicular to the extension direction of the electrodes RME. However, the embodiments are not limited thereto, and the light emitting elements ED may each be arranged to extend in a direction oblique to the extension direction of the electrodes RME.

The light emitting element ED may include semiconductor layers doped with different conductivity type dopants. The light emitting element ED may include semiconductor layers and may be oriented such that one end thereof faces a certain direction according to the direction of the electric field generated on the electrode RME. The light emitting element ED may include a light emitting layer 36 (refer to FIG. 9) to emit light of a predetermined wavelength band. The light emitting element ED aligned in each sub-pixel PXn may emit light of a different wavelength band according to the material constituting the light emitting layer 36. However, the embodiments are not limited thereto, and the light emitting element ED aligned in each sub-pixel PXn may emit the same color light.

The light emitting element ED may include layers arranged in a direction parallel to the top surface of the first substrate SUB. The light emitting element ED of the display device 10 may be disposed such that an extension direction thereof is parallel to the first substrate SUB, and the semiconductor layers included in the light emitting element ED may be sequentially arranged in a direction parallel to the top surface of the first substrate SUB. However, the embodiments are not limited thereto. In some cases, when the light emitting element ED has a different structure, the layers may be arranged in a direction perpendicular to the first substrate SUB.

The light emitting element ED may be disposed above the electrodes RME that are spaced apart from each other in the second direction DR2 between the second bank BNL2 and the third bank BNL3. The extension length of the light emitting element ED may be greater than the gap between the electrodes RME spaced apart in the second direction DR2, and both ends of the light emitting element ED may be disposed on different electrodes. For example, the light emitting element ED may include a first light emitting element ED1 whose both ends are respectively disposed on the first electrode RME1 and the third electrode RME3, and a second light emitting element ED2 whose both ends are respectively disposed on the first electrode RME1 and the second electrode RME2.

The light emitting element ED may include semiconductor layers, and a first end and a second end opposite thereto may be defined with respect to any of the semiconductor layers. The light emitting element ED may be disposed such that the first end and the second end are respectively placed on specific electrodes RME. For example, the first light emitting element ED1 may be disposed such that the first end is disposed on the first electrode RME1 and the second end is disposed on the third electrode RME3. The second light emitting element ED2 may be disposed such that the first end is disposed on the first electrode RME1 and the second end is disposed on the second electrode RME2. However, the embodiments are not limited thereto, and the light emitting elements ED may be disposed such that only one end is placed on the electrode RME according to an orientation thereof between the electrodes RME.

The ends of the light emitting element ED may contact the respective contact electrodes CNE. In the light emitting element ED, since an insulating layer 38 (refer to FIG. 9) is not formed on the end surfaces in the extension direction, and thus the semiconductor layer is partially exposed, the exposed semiconductor layer may be in contact with the contact electrode CNE. However, the embodiments are not limited thereto. In other embodiments, at least a portion of the insulating layer 38 of light emitting element ED may be removed, so that the side surfaces at the ends of the semiconductor layers may be partially exposed. The side surfaces of the exposed semiconductor layer may be in direct contact with the contact electrodes CNE. Each of the light emitting elements ED may be electrically connected to the electrode RME or another light emitting element ED through the contact electrode CNE.

The second insulating layer PAS2 may be partially disposed on the first insulating layer PAS1 and the light emitting element ED. For example, the second insulating layer PAS2 may be disposed to partially cover the outer surface of the light emitting element ED so as not to cover the first and second ends of the light emitting element ED. The portion of the second insulating layer PAS2 disposed on the light emitting element ED may be arranged to extend in the first direction DR1 on the first insulating layer PAS1 in a plan view, so that it may form a linear or island-like pattern in each sub-pixel PXn. The second insulating layer PAS2 may protect the light emitting element ED while fixing the light emitting element ED during the fabricating process of the display device 10. The second insulating layer PAS2 may be disposed to fill the space between the light emitting element ED and the first insulating layer PAS1 thereunder.

Furthermore, the second insulating layer PAS2 may also be disposed on the first bank BNL1. The second insulating layer PAS2 may be disposed on the first insulating layer PAS1 and the first bank BNL1 while exposing the ends of the light emitting element ED and partially exposing the portions where the electrodes RME are disposed. The shape of the second insulating layer PAS2 may be formed through steps of entirely disposing it on the first insulating layer PAS1 and partially removing it to expose the ends of the light emitting element ED, during the fabricating process of the display device 10.

The second insulating layer PAS2 may also be partially disposed in the sub-region SA. The electrodes RME may be formed by separating the electrode lines at the separating portion ROP of the sub-region SA after aligning the light emitting elements ED and forming the second insulating layer PAS2. In the separating step of the electrode line, in addition to the electrodes RME, the first insulating layer PAS1 and the second insulating layer PAS2 may also be partially removed, and the via layer VIA may be partially exposed in the separating portion ROP.

The contact electrodes CNE may be disposed on the second insulating layer PAS2. The contact electrode CNE may be in electrical contact with any one end of the light emitting element ED and at least one electrode RME. For example, the contact electrode CNE may be in contact with one end of the light emitting element ED exposed without the second insulating layer PAS2 disposed thereon, and at least one of the electrodes RME through the contact portions CT1, CT2, and CT3 formed in the first insulating layer PAS1 to partially expose the electrodes RME. Each of the contact electrodes CNE may include a portion extending in the first direction DR1 to be disposed across the emission area EMA and the sub-region SA. The contact electrode CNE may include a portion disposed in the emission area EMA, which is in contact with the light emitting element ED, and a portion disposed in the sub-region SA, which is in contact with the electrode RME through the contact portion CT1, CT2, CT3. The contact electrodes CNE may be arranged on the first bank BNL1 disposed between the emission area EMA and the sub-region SA.

According to an embodiment, the contact electrodes CNE of the display device 10 may be classified into different types of contact electrodes that are electrically connected to different types of electrodes. For example, the contact electrode CNE may include a first contact electrode CNE1 and a second contact electrode CNE2 as first type contact electrodes disposed on the first electrode RME1 or the second electrode RME2 that is the first type electrode.

The first contact electrode CNE1 and the second contact electrode CNE2 may be disposed on the first electrode RME1 and the second electrode RME2, respectively. The first contact electrode CNE1 and the second contact electrode CNE2 each have a shape extending in the first direction DR1, and may form linear patterns in the emission area EMA of each sub-pixel PXn. The first contact electrode CNE1 may be in contact with the first electrode RME1 through the first contact portion CT1 that exposes the top surface of the first electrode RME1, and the second contact electrode CNE2 may be in contact with the second electrode RME2 through the second contact portion CT2 that exposes the top surface of the second electrode RME2. The first contact electrode CNE1 may be in contact with the first end of the first light emitting element ED1 and the second contact electrode CNE2 may be in contact with the second end of the second light emitting element ED2.

Each of the first contact electrode CNE1 and the second contact electrode CNE2 as the first type contact electrode may transmit an electrical signal applied to the first type electrode to one end of the light emitting element ED. The electrical signals may be directly applied to the first end of the first light emitting element ED1 and the second end of the second light emitting element ED2, and transmitted to other contact electrodes CNE and other light emitting elements ED through the second end of the first light emitting element ED1 and the first end of the second light emitting element ED2.

The contact electrode CNE may include a third contact electrode CNE3 as a second type contact electrode disposed over the third electrode RME3 that is the second type electrode and the first electrode RME1 that is the first type electrode.

The third contact electrode CNE3 may be disposed above the first electrode RME1 and the third electrode RME3. The third contact electrode CNE3 may include a first extension portion CN_E1 and a second extension portion CN_E2 extending in the first direction DR1, and a first connection portion CN_B1 (or connection portion) connecting the first extension portion CN_E1 to the second extension portion CN_E2. The third contact electrode CNE3 may have a shape substantially surrounding the first contact electrode CNE1.

The first extension portion CN_E1 is disposed above the third electrode RME3, and the second extension portion CN_E2 is disposed above the first electrode RME1 while being spaced apart from the first contact electrode CNE1. The first extension portion CN_E1 may face the first contact electrode CNE1 while being spaced apart therefrom, and the second extension portion CN_E2 may face the second contact electrode CNE2 while being spaced apart therefrom. The first extension portion CN_E1 may be in contact with the third electrode RME3 exposed through the third contact portion CT3, but the second extension portion CN_E2 may not be in contact with the first electrode RME1. The first extension portion CN_E1 may be in contact with the second end of the first light emitting element ED1 and the second extension portion CN_E2 may be in contact with the first end of the second light emitting element ED2. An electrical signal may be transmitted to the third electrode RME3 through the third contact electrode CNE3. The first connection portion CN_B1 (or connection portion) may be disposed on the first bank BNL1 disposed between the emission area EMA and the sub-region SA of another sub-pixel PXn in the first direction DR1.

The first light emitting element ED1 may be electrically connected to the second light emitting element ED2 through the third contact electrode CNE3. The electrical signal applied to the first contact electrode CNE1 may be transmitted to the second light emitting element ED2 through the first light emitting element ED1 and the third contact electrode CNE3. The light emitting elements ED disposed in a sub-pixel PXn may be connected in series via the second type contact electrode.

The contact portions CT1, CT2, and CT3 may be disposed so as not to overlap the light emitting elements ED in the second direction DR2. The contact portions CT1, CT2, and CT3 may be formed to be spaced apart from the area, in which the light emitting elements ED are disposed, in the first direction DR1. Light may be emitted from the ends of the light emitting element ED, and the contact portions CT1, CT2, and CT3 may be positioned away from the traveling paths of the light. In an embodiment, the contact portions CT1, CT2, and CT3 may be formed in the sub-region SA where the light emitting elements ED are not disposed. As the contact portions CT1, CT2, and CT3 are disposed in the sub-region SA, it may be possible to minimize light that is not emitted due to the refraction of light by the contact portions CT1, CT2, CT3. During the fabricating process of the display device 10, by disposing the contact portions CT1, CT2, and CT3 away from where the light emitting elements ED are disposed may prevent light emitting elements ED from agglomerating near the contact portions CT1, CT2, and CT3 that expose the top surfaces of the electrodes RME, which may attract the light emitting elements ED.

The contact electrodes CNE may be disposed on the second insulating layer PAS2 to be spaced apart from each other, but may be disposed directly on the first insulating layer PAS1 and the light emitting element ED in portions where the second insulating layer PAS2 is not disposed. However, the embodiments are not limited thereto, and other insulating layers may be further disposed between the contact electrodes CNE, so that some of the contact electrodes CNE may be disposed on the same layer and others may be disposed on a different layer.

The contact electrode CNE may include a conductive material. For example, it may include ITO, IZO, ITZO, aluminum (Al), or the like. As an example, the contact electrodes CNE may include a transparent conductive material, and light emitted from the light emitting element ED may pass through the contact electrodes CNE and proceed toward the electrodes RME. However, the embodiments are not limited thereto.

Although not shown in the drawing, an insulating layer may be further disposed on the contact electrodes CNE to cover them. The insulating layer may be disposed all over the first substrate SUB to protect the members disposed on the first substrate SUB from the external environment.

Each of the first insulating layer PAS1 and the second insulating layer PAS2 described above may include an inorganic insulating material or an organic insulating material. However, the embodiments are not limited thereto.

As described above, in the display device 10 according to an embodiment, the first bank BNL1 may include the trench portions TP having a relatively low height in order to decrease the height difference from the emission area EMA and the sub-region SA. Each of the trench portions TP of the first bank BNL1 may form a space in which the contact electrode CNE disposed across the emission area EMA and the sub-region SA may be placed, thereby preventing the material of the contact electrode CNE from being broken due to the height difference of the first bank BNL1.

Figure 6:
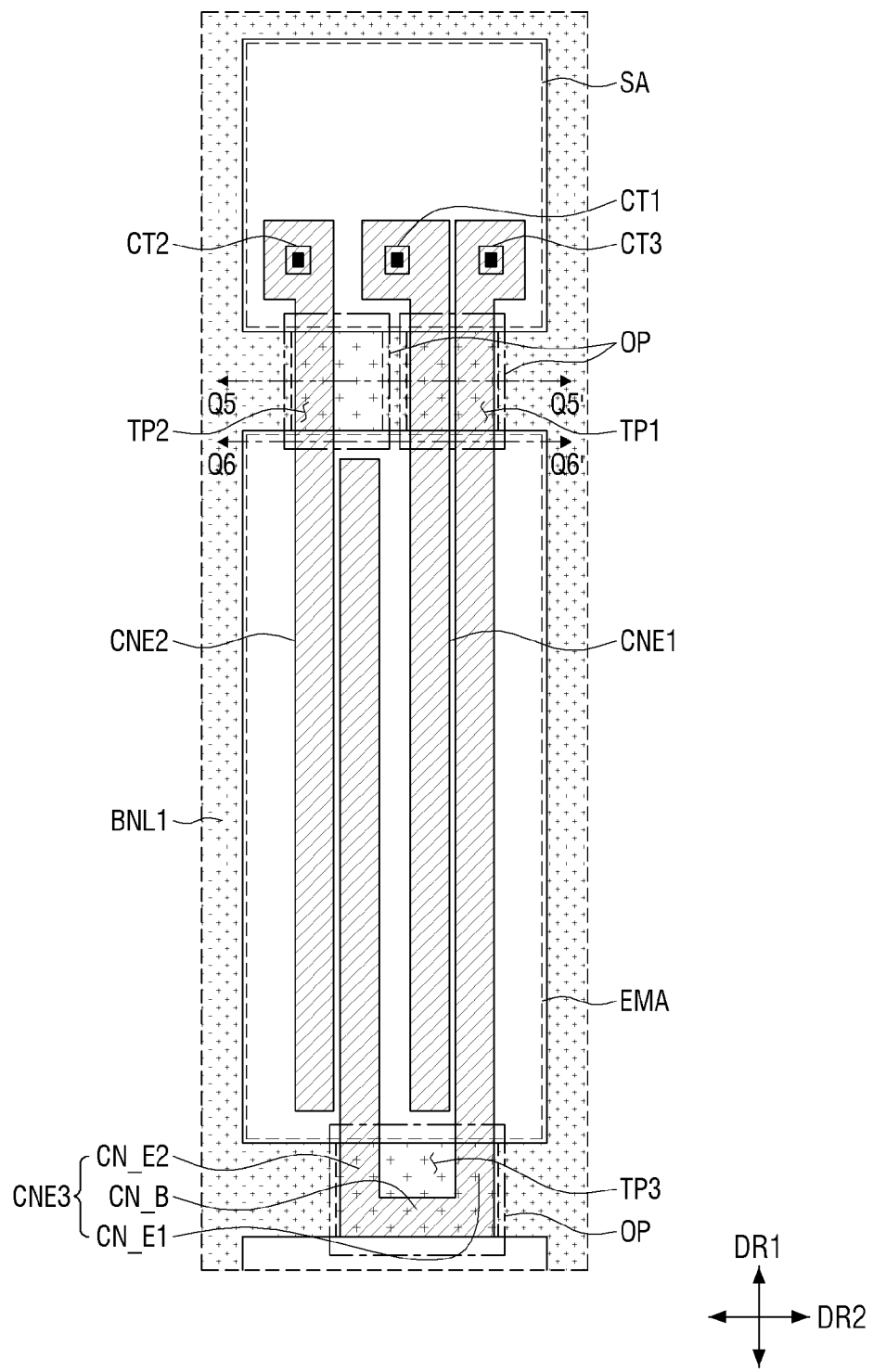
FIG. 6 is a schematic plan view illustrating a schematic arrangement of a first bank and contact electrodes disposed in a sub-pixel of a display device according to an embodiment.
Figure 7:
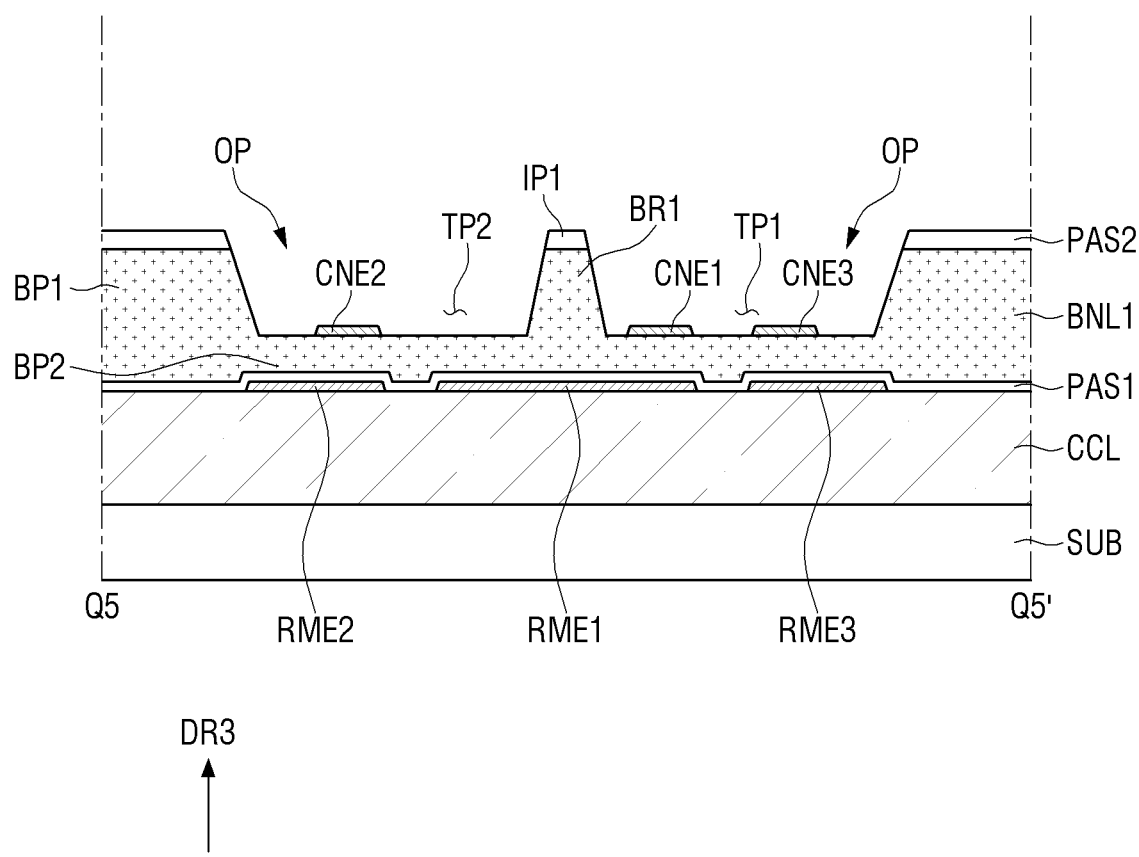
FIG. 7 is a schematic cross-sectional view taken along line Q5-Q5' of FIG. 6.
Figure 8:
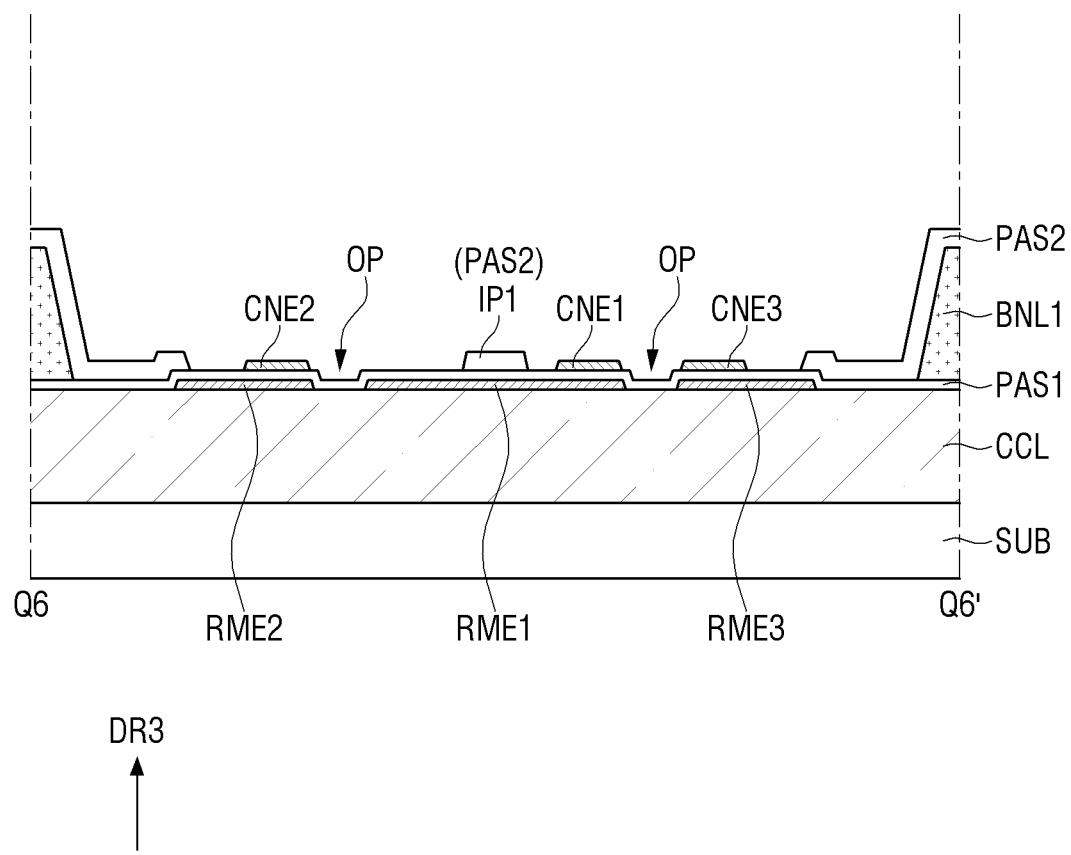
FIG. 8 is a schematic cross-sectional view taken along line Q6-Q6' of FIG. 6.

FIG. 6 is a schematic plan view illustrating a schematic arrangement of a first bank and a contact electrodes disposed in a sub-pixel of a display device according to an embodiment. FIG. 7 is a schematic cross-sectional view taken along line Q5-Q5' of FIG. 6. FIG. 8 is a schematic cross-sectional view taken along line Q6-Q6' of FIG. 6. FIG. 6 illustrates a relative arrangement of the first bank BNL1 and the contact electrodes CNE of a sub-pixel PXn. FIG. 7 illustrates a cross-section through the trench portions TP of the first bank BNL1, and FIG. 8 illustrates a cross-section through openings OP of the second insulating layer PAS2 adjacent to the trench portion TP.

Referring to FIGS. 6 and 7 in conjunction with FIG. 3, in the display device 10 according to an embodiment, the first bank BNL1 may include the trench portions TP having a lower height than other portions. The first bank BNL1 has a predetermined height, and is disposed to surround the emission area EMA and the sub-region SA. The first bank BNL1 may include the trench portions TP, in which the top surface of the first bank BNL1 is partially depressed, in a region between the emission area EMA and the sub-region SA.

For example, the first bank BNL1 includes a first trench portion TP1 and a second trench portion TP2 disposed on an upper side (in the first direction DR1) of the emission area EMA, between the emission area EMA and the sub-region SA of the corresponding sub-pixel PXn. The first bank BNL1 may further include a third trench portion TP3 disposed on a lower side (in the first direction DR1) of the emission area EMA between the emission area EMA and the sub-region SA of another sub-pixel PXn. The first bank BNL1 may be divided into a first bank portion BP1 that has a predetermined height, and a second bank portion BP2 that includes the trench portions TP formed therein and thus has a height lower than the first bank portion BP1.

The first trench portion TP1 and the second trench portion TP2 may be spaced apart from each other in the second direction DR2 between the emission area EMA and the sub-region SA of the sub-pixel PXn. A first bridge bank portion BR1 (or bridge bank portion) having the same height as the first bank portion BP1 may be disposed between the first trench portion TP1 and the second trench portion TP2. The first bridge bank portion BR1 (or bridge bank portion) may extend in the first direction DR1 between the first trench portion TP1 and the second trench portion TP2 and may be in contact with the emission area EMA and the sub-region SA.

As going from the emission area EMA to the sub-region SA, a height difference may occur by the first bank BNL1 disposed therebetween. In the first bank BNL1, since the second bank portion BP2 where the trench portion TP is formed has a relatively low height compared to the first bank portion BP1, it is possible to decrease the height difference between the first bank BNL1, and the emission area EMA and the sub-region SA. Similarly, the third trench portion TP3 is disposed between the emission area EMA and the sub-region SA of different sub-pixels PXn, thereby decreasing the height difference by the first bank BNL1.

In some embodiments, the third trench portion TP3 may have a width greater than the first trench portion TP1 and the second trench portion TP2. However, the embodiments are not limited thereto, and the widths of the trench portions TP may vary. In some embodiments, the first trench portion TP1 may be connected to the second trench portion TP2, together forming a trench portion TP. The first bridge bank portion BR1 (or bridge bank portion) between the first trench portion TP1 and the second trench portion TP2 may be omitted.

According to an embodiment, the second insulating layer PAS2 may be disposed on the first bank BNL1, and the second insulating layer PAS2 may include the openings OP corresponding to the trench portions TP of the first bank BNL1. The second insulating layer PAS2 may not be disposed in the trench portions TP. The top surface of the first bank BNL1 or the first insulating layer PAS1 may be partially exposed through the openings OP. The openings OP of the second insulating layer PAS2 may be located to correspond to the trench portions TP of the first bank BNL1, but may occupy greater areas than the trench portions TP in a plan view. The top surface of the first bank BNL1 or the first insulating layer PAS1, which may be located in the opening OP of the second insulating layer PAS2, may be.

As shown in FIG. 7, the second insulating layer PAS2 may not be disposed on the first trench portion TP1 and the second trench portion TP2 so that the top surface of the first bank BNL1 in the trench portions TP1 and TP2 may be exposed, and the second insulating layer PAS2 may be disposed on the first bank portion BP1 and the first bridge bank portion BR1 (or bridge bank portion) that are regions other than the trench portion TP. In an embodiment, the second insulating layer PAS2 may include a first bridge pattern IP1 disposed on the first bridge bank portion BR1 (or bridge bank portion). The first bridge pattern IP1 may have a shape extending in the first direction DR1 between the emission area EMA and the sub-region SA. The first bridge pattern IP1 may connect a portion of the second insulating layer PAS2 disposed in the emission area EMA to a portion of the second insulating layer PAS2 disposed in the sub-region SA.

As illustrated in FIG. 8, among the openings OP of the second insulating layer PAS2, the opening disposed in the emission area EMA may expose the top surface of the first insulating layer PAS1 directly. The second insulating layer PAS2 may include not only the portions exposing both ends of the light emitting element ED but also the openings OP formed to correspond to the trench portions TP of the first bank BNL1 to partially expose the top surface of the first insulating layer PAS1 or the first bank BNL1.

According to an embodiment, the sidewall of the trench portion TP of the first bank BNL1 may be aligned with the sidewall of the second insulating layer PAS2 disposed on the first bank portion BP1. As will be described below, a step of forming the trench portion TP of the first bank BNL1 may be performed simultaneously with a step of forming the opening OP of the second insulating layer PAS2. Since the trench portion TP and the opening OP may be formed in the same step, the sidewall of the trench portion TP of the first bank BNL1 may be aligned with the sidewall of the second insulating layer PAS2.

The contact electrodes CNE may be disposed across the emission area EMA and the sub-region SA, and may also be disposed on the first bank BNL1 between the emission area EMA and the sub-region SA. The trench portions TP of the first bank BNL1 may provide spaces in which the contact electrodes CNE are arranged across the emission area EMA and the sub-region SA. The first trench portion TP1 may overlap the first contact electrode CNE1 and the first extension portion CN_E1 of the third contact electrode CNE3, and the second trench portion TP2 may overlap the second contact electrode CNE2. The third trench portion TP3 may overlap the first connection portion CN_B1 (or connection portion) of the third contact electrode CNE3. The contact electrodes CNE disposed on the second insulating layer PAS2 in the emission area EMA may be directly arranged on the first bank BNL1 in the trench portion TP of the first bank BNL1. Furthermore, the contact electrodes CNE may be directly arranged on the first insulating layer PAS1 in the opening OP of the second insulating layer PAS2 formed in the region adjacent to the trench portion TP.

In the fabricating process of the display device 10, the light emitting elements ED may be aligned by an electric field generated on the electrode line. The electrode line is separated in a subsequent processing step to form the electrodes RME, and the first insulating layer PAS1 including the contact portions CT1, CT2, and CT3 formed therein may be disposed on the electrode lines. The electric field generated on the electrode line may have a relatively strong intensity in regions adjacent to the contact portions CT1, CT2 and CT3 through which the top surface of the electrode line is exposed. In order to prevent the light emitting elements ED from gathering near the contact portions CT1, CT2, and CT3, the display device 10 may include the first bank BNL1 surrounding the emission area EMA and the sub-region SA, and the contact portions CT1, CT2, and CT3 may be disposed in the sub-region SA, and not disposed in the emission area EMA. The top surfaces of the electrodes RME may be partially exposed in the sub-region SA, but not exposed in the emission area EMA.

Since the light emitting elements ED are disposed on the electrodes RME in the emission area EMA, the contact electrodes CNE in contact with the light emitting elements ED and the electrodes RME may be disposed across the emission area EMA and the sub-region SA. The first bank BNL1 having a predetermined height may be disposed between the emission area EMA and the sub-region SA, and the emission area EMA and the sub-region SA may have heights lower than the first bank BNL1. From the emission area EMA to the sub-region SA in the first direction DR1, a height difference may occur by the first bank BNL1.

In order to partially decrease the height difference by the first bank BNL1, the display device 10 according to an embodiment may include the trench portion TP at which the first bank BNL1 has a lower height than other parts of the first bank BNL1. The trench portion TP may extend in the first direction DR1 to form a space in which the contact electrodes CNE disposed across the emission area EMA and the sub-region SA are placed. The contact electrodes CNE are disposed from the emission area EMA, in which the first bank BNL1 is not disposed, to the sub-region SA through the trench portion TP of the first bank BNL1. As the contact electrodes CNE are arranged on the relatively low trench portion TP, it is possible to prevent material breakage due to a lower stepped portion. By decreasing the slope of the first bank BNL1, different contact electrodes CNE can be prevented from being short-circuited due to residues of a material used in a step of forming the contact electrodes CNE.

Figure 9:
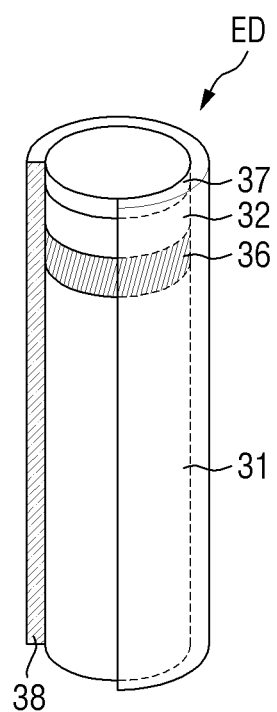
FIG. 9 is a schematic diagram of a light emitting element according to an embodiment.

FIG. 9 is a schematic diagram of a light emitting element according to an embodiment.

Referring to FIG. 9, the light emitting element ED may be a light emitting diode. Specifically, the light emitting element ED may be an inorganic light emitting diode that has a nanometer or micrometer size, and is made of an inorganic material. The light emitting element ED may be aligned between two electrodes having polarity when an electric field is formed in a specific direction between two electrodes opposing each other.

The light emitting element ED according to an embodiment may have an elongated shape. The light emitting element ED may have a shape of a cylinder, a rod, a wire, a tube, or the like. However, the shape of the light emitting element ED is not limited thereto, and the light emitting element ED may have a polygonal prism shape such as a regular cube, a rectangular parallelepiped, and a hexagonal prism, or may have various shapes such as a shape elongated in one direction and having an outer surface partially inclined.

The light emitting element ED may include a semiconductor layer doped with any conductivity type (e.g., p-type or n-type) impurities. The semiconductor layer may emit light of a specific wavelength band by receiving an electrical signal applied from an external power source. The light emitting element ED may include a first semiconductor layer 31, a second semiconductor layer 32, a light emitting layer 36, an electrode layer 37 and an insulating layer 38.

The first semiconductor layer 31 may be an n-type semiconductor. The first semiconductor layer 31 may include a semiconductor material having a chemical formula of $Al_xGa_yIn_{1-x-y}N$ ($0 \leq x \leq 1$, $0 \leq y \leq 1$, $0 \leq x+y \leq 1$). For example, it may include at least one or more of n-type doped AlGaInN, GaN, AlGaN, InGaN, MN and InN. The n-type dopant doped into the first semiconductor layer 31 may be Si, Ge, Sn, or the like. The first end of the light emitting element ED may be a portion in which the first semiconductor layer 31 is disposed in relation to the light emitting layer 36.

The second semiconductor layer 32 is disposed on the first semiconductor layer 31 with the light emitting layer 36 therebetween. The second semiconductor layer 32 may be a p-type semiconductor, and the second semiconductor layer 32 may include a semiconductor material having a chemical formula of AlxGayIn1-x-yN (0≤x≤1, 0≤y≤1, 0≤x+y≤1). For example, it may include at least one or more of p-type doped AlGaInN, GaN, AlGaN, InGaN, MN and InN. The p-type dopant doped into the second semiconductor layer 32 may be Mg, Zn, Ca, Se, Ba, or the like. The second end of the light emitting element ED may be a portion in which the second semiconductor layer 32 is disposed in relation to the light emitting layer 36.

Although it is illustrated in the drawing that the first semiconductor layer 31 and the second semiconductor layer 32 are configured as one layer, the embodiments are not limited thereto. Depending on the material of the light emitting layer 36, the first semiconductor layer 31 and the second semiconductor layer 32 may further include a larger number of layers, such as a cladding layer or a tensile strain barrier reducing (TSBR) layer.

The light emitting layer 36 is disposed between the first semiconductor layer 31 and the second semiconductor layer 32. The light emitting layer 36 may include a material having a single or multiple quantum well structure. When the light emitting layer 36 includes a material having a multiple quantum well structure, quantum layers and well layers may be stacked alternately. The light emitting layer 36 may emit light by coupling of electron-hole pairs according to an electrical signal applied through the first semiconductor layer 31 and the second semiconductor layer 32. The light emitting layer 36 may include a material such as AlGaN or AlGaInN. In case that the light emitting layer 36 has a structure in which quantum layers and well layers are alternately stacked in a multiple quantum well structure, the quantum layer may include a material such as AlGaN or AlGaInN, and the well layer may include a material such as GaN or AlInN.

The light emitting layer 36 may have a structure in which semiconductor materials having large band gap energy and semiconductor materials having small band gap energy are alternately stacked, and may include other group III to V semiconductor materials according to the wavelength band of the emitted light. The light emitted by the light emitting layer 36 is not limited to light of a blue wavelength band, but the active layer 36 may also emit light of a red or green wavelength band in some cases.

The electrode layer 37 may be an ohmic contact electrode. However, the embodiments are not limited thereto, and it may be a Schottky contact electrode. The light emitting element ED may include at least one electrode layer 37. The light emitting element ED may include one or more electrode layers 37, but the embodiments are not limited thereto, and the electrode layer 37 may be omitted.

In the display device 10, when the light emitting element ED is electrically connected to an electrode or a contact electrode, the electrode layer 37 may reduce the resistance between the light emitting element ED and the electrode or contact electrode. The electrode layer 37 may include conductive metal. For example, the electrode layer 370 may include at least one of aluminum (Al), titanium (Ti), indium (In), gold (Au), silver (Ag), ITO, IZO, and ITZO.

The insulating layer 38 may be arranged to surround the outer surfaces of the semiconductor layers and electrode layers described above. For example, the insulating layer 38 may be disposed to surround at least the outer surface of the light emitting layer 36, and may be formed to expose both ends of the light emitting element ED in the longitudinal direction. In a cross-sectional view, the insulating layer 38 may have a top surface, which is rounded in a region adjacent to at least one end of the light emitting element ED.

The insulating layer 38 may include a material having insulating properties, such as silicon oxide (SiOx), silicon nitride (SiNx), silicon oxynitride (SiOxNy), aluminum nitride (AlNx), and aluminum oxide AlOx). It is illustrated in the drawing that the insulating layer 38 is formed as a single layer, but the embodiments are not limited thereto. In some embodiments, the insulating layer 38 may be formed in a multilayer structure having layers stacked therein.

The insulating layer 38 may function to protect the members. The insulating layer 38 may prevent an electrical short circuit that is likely to occur at the light emitting layer 36 when an electrode to which an electrical signal is transmitted is in direct contact with the light emitting element ED. The insulating layer 38 may prevent a decrease in light emission efficiency of the light emitting element ED.

The insulating layer 38 may have an outer surface which is surface-treated. The light emitting elements ED may be aligned in such a way of spraying the ink in which the light emitting elements ED are dispersed on the electrodes. Here, the surface of the insulating layer 38 may be treated in a hydrophobic or hydrophilic manner in order to keep the light emitting elements ED in a dispersed state without agglomerating with other light emitting elements ED adjacent in the ink.

Hereinafter, a fabricating process of the display device 10 will be described with further reference to other drawings.

Figure 10:
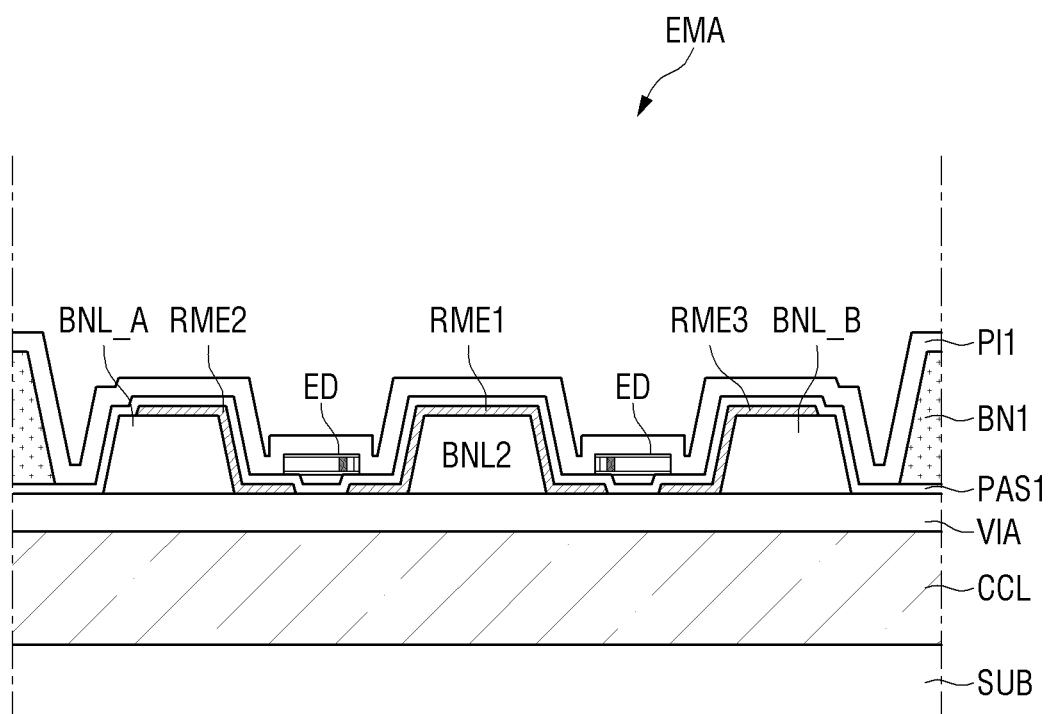
FIGS. 10 to 15 are schematic views illustrating a portion of a fabricating process of a display device according to an embodiment.
Figure 11:
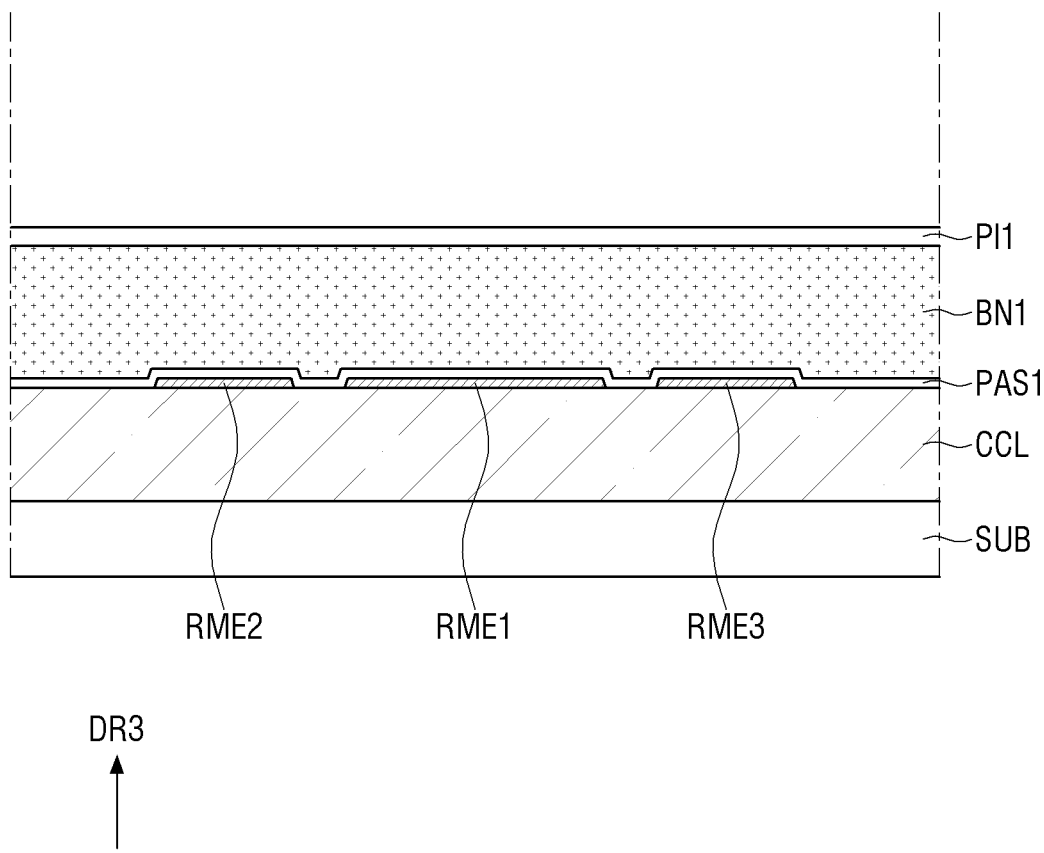
Figure 12:
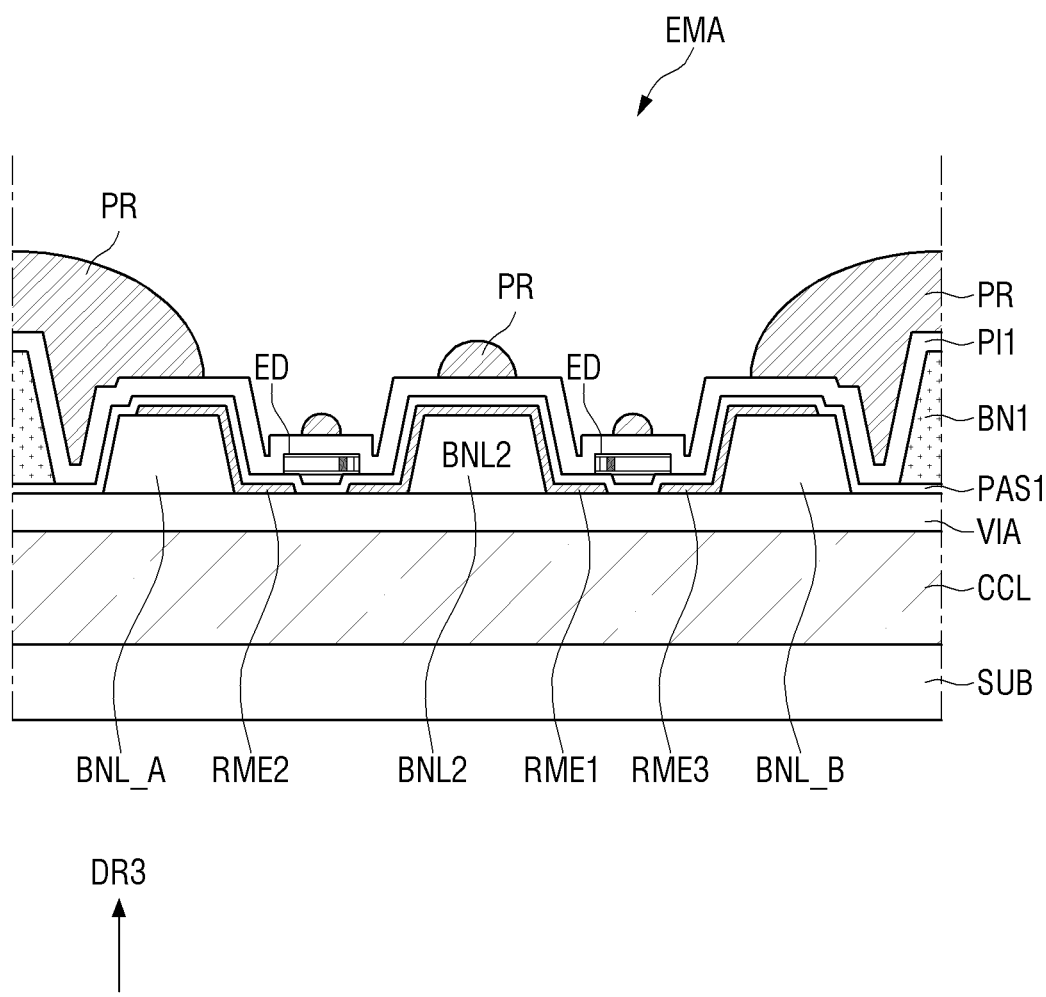
Figure 13:
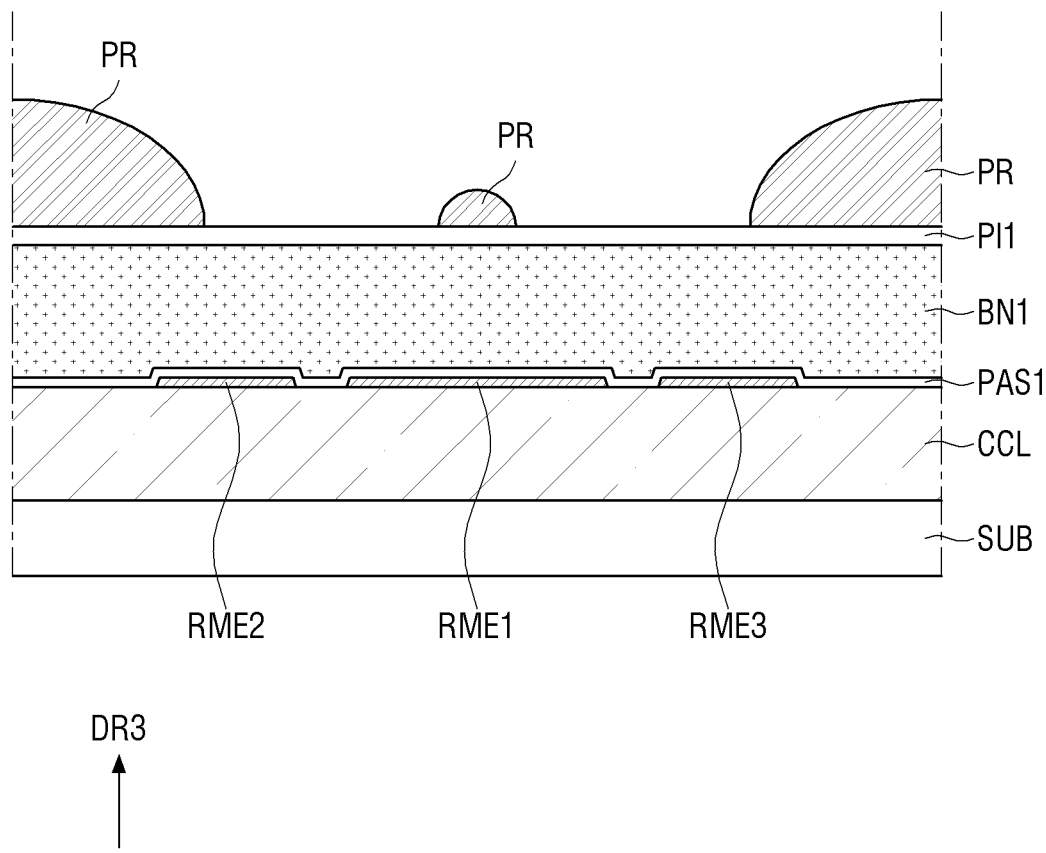
Figure 14:
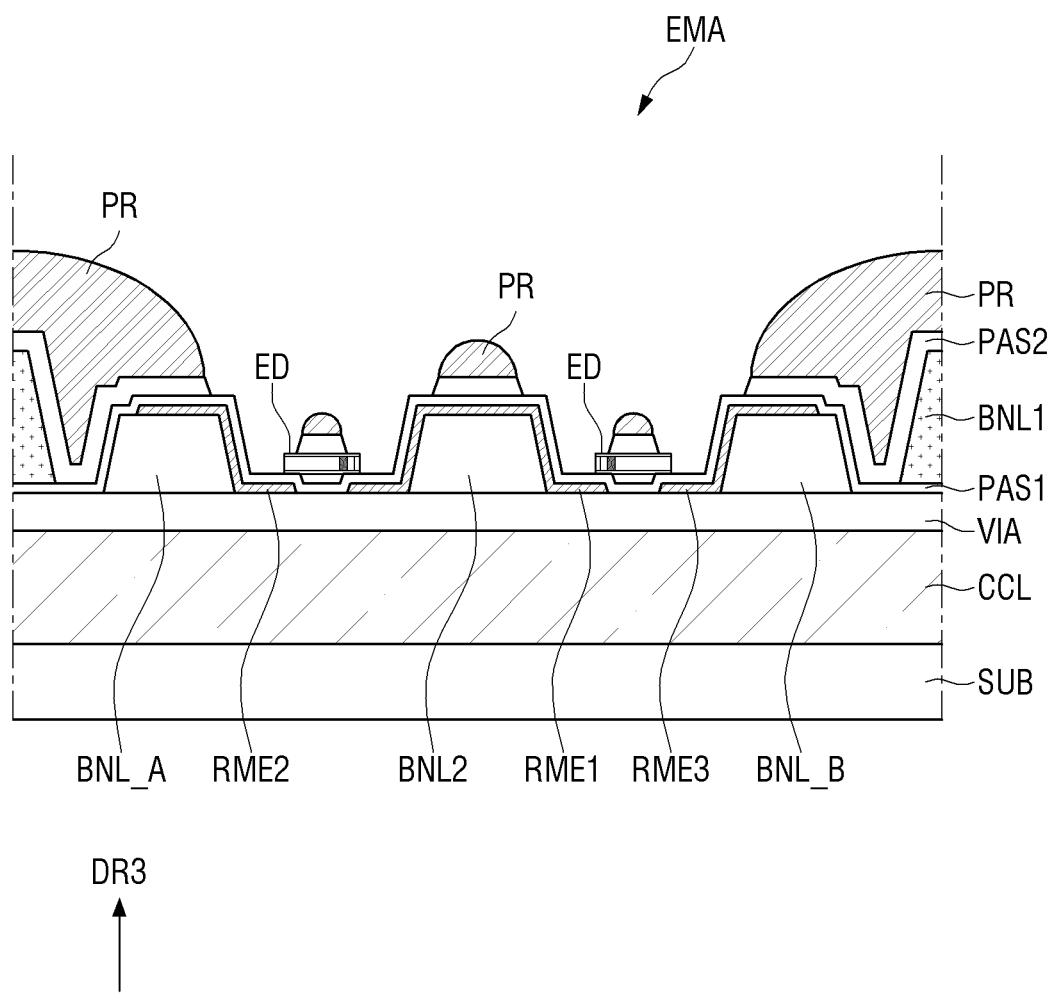
Figure 15:
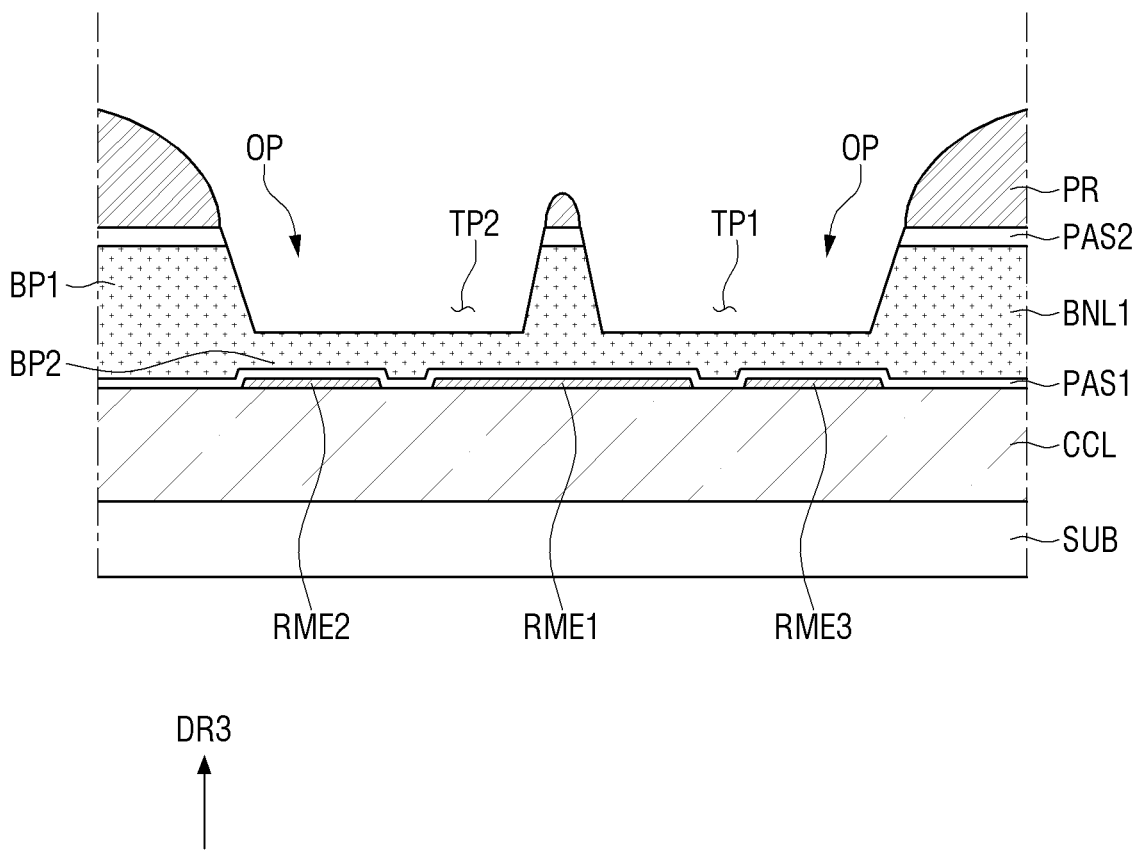

FIGS. 10 to 15 are schematic views illustrating a portion of a fabricating process of a display device according to an embodiment. FIGS. 10 to 15 illustrate a step of forming the second insulating layer PAS2 disposed on the light emitting element ED in the emission area EMA, and a step of forming the first bank BNL 1 in the region between the emission area EMA and the sub-region SA, sequentially. FIGS. 10, 12, and 14 illustrate the step of forming the second insulating layer PAS2 in the emission area EMA, which corresponds to the portion on line Q2-Q2' of FIG. 4, and FIGS. 11, 13, and 15 illustrates the step of forming the first bank BNL1 in the region between the emission area EMA and the sub-region SA, which corresponds to FIG. 7.

First, referring to FIGS. 10 and 11, the first substrate SUB is prepared, the circuit layer CCL, the second bank BNL2, the third bank BNL3, the electrodes RME, the first insulating layer PAS1, and a first bank layer BN1 are formed on the first substrate SUB, and the light emitting elements ED are disposed on the electrodes RME.

The first bank layer BN1 may be formed to surround the emission area EMA and the sub-region SA. The first bank layer BN1 may be formed to have the same height as the first bank portion BP1 of FIG. 7. The first bank layer BN1 may prevent overflow of ink including the light emitting element ED in a subsequent step.

In the display device 10 according to an embodiment, the light emitting elements ED may be disposed on the electrodes RME through an inkjet printing step. The light emitting element ED including semiconductor layers doped with different conductivity types may have intramolecular interaction, (e.g., dipole-dipole interaction), and may be disposed on the electrode lines by a dielectrophoretic force induced by an electric field in ink.

Ink sprayed to each sub-pixel PXn may be seated in the emission area EMA surrounded by the first bank layer BN1. The first bank layer BN1 may prevent the ink from overflowing into the adjacent emission area EMA. Furthermore, even if inks including different types of light emitting elements ED are sprayed to different sub-pixels PXn, they may be prevented from being mixed.

Subsequently, a first insulating material layer PI1 is formed on the first bank layer BN1 to cover the light emitting elements ED. The first bank layer BN1 and the first insulating material layer PI1 may be patterned in a subsequent step to form the first bank BNL1 and the second insulating layer PAS2 of the display device 10 according to an embodiment. The first insulating material layer PI1 may fix the light emitting elements ED to the arranged locations while protecting them.

Referring to FIGS. 12 to 15, a photoresist PR is formed on the first insulating material layer PI1, and the first insulating material layer PI1 and the first bank layer BN1 are patterned along the photoresist PR to form the second insulating layer PAS2 and the first bank BNL1. The photoresist PR may be disposed while partially exposing the top surface of the first insulating material layer PI1. The photoresist PR may be disposed on the first insulating material layer PI1 to correspond to the portions where the second insulating layer PAS2 is formed, shown in FIGS. 4 and 7.

According to an embodiment, in the step of forming the second insulating layer PAS2 by patterning the first insulating material layer PI1, the top surface of the first bank layer BN1 may be partially removed together to form the trench portions TP of the first bank BNL1. In some embodiments, since the second insulating layer PAS2 includes an inorganic insulating material, and the first bank BNL1 includes an organic insulating material, the organic insulating material may also be removed together in the patterning step of the inorganic insulating material. When patterning the portion of the first insulating material layer PI1, which is exposed without the photoresist PR disposed thereon, the first bank layer BN1 disposed thereunder may also be partially removed. The portion of the first bank layer BN1, from which the material has been removed, may have a lower height than other portions. In the patterning step for forming the second insulating layer PAS2, the first bank layer BN1 may also be partially patterned to form the first bank BNL1 including the trench portions TP.

Although not shown in the drawing, the contact electrodes CNE are formed on the second insulating layer PAS2 to fabricate the display device 10.

Hereinafter, other embodiments of the display device 10 will be described with reference to other drawings.

Figure 16:
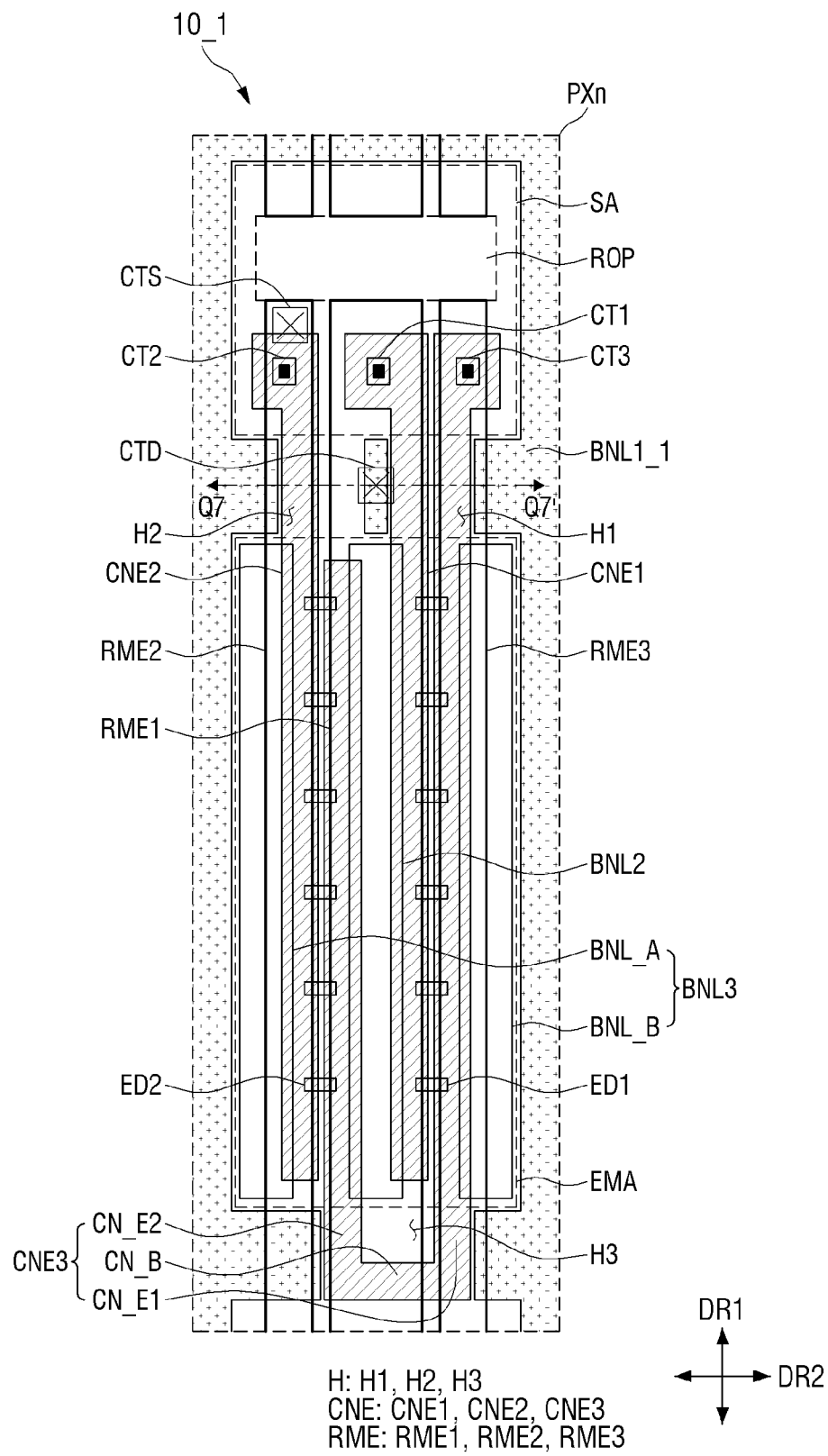
FIG. 16 is a schematic plan view illustrating a sub-pixel of a display device according to an embodiment.
Figure 17:
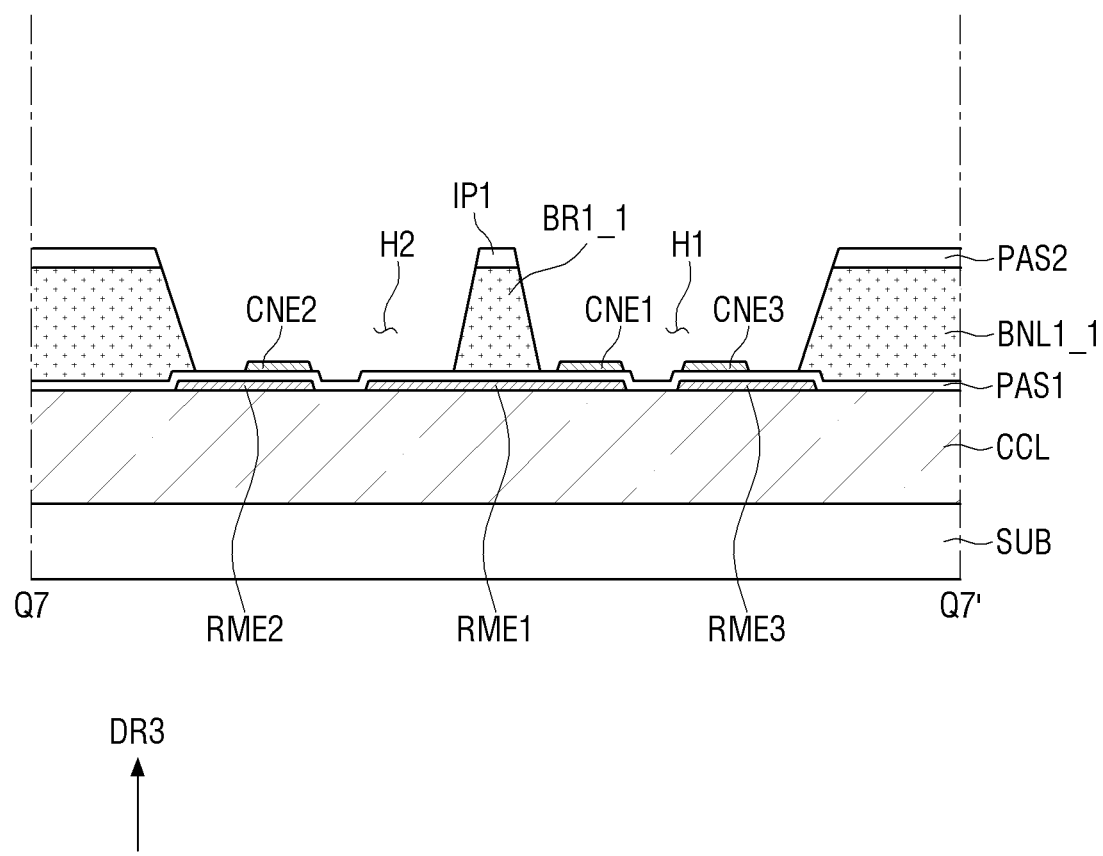
FIG. 17 is a schematic cross-sectional view taken along line Q7-Q7' of FIG. 16.

FIG. 16 is a schematic plan view illustrating a sub-pixel of a display device according to an embodiment. FIG. 17 is a schematic cross-sectional view taken along line Q7-Q7' of FIG. 16. FIG. 17 illustrates a cross-section through a holes H of a first bank BNL1_1.

Referring to FIGS. 16 and 17, a display device 10_1 according to an embodiment may include the holes H that are disposed between the emission area EMA and the sub-region SA to partially expose the top surface of the first insulating layer PAS1. The display device 10_1 may include the holes H formed by removing the first bank BNL1_1 in order to secure a space in which the contact electrodes CNE are disposed across the emission area EMA and the sub-region SA. The display device 10_1 according to the embodiment is different from the embodiment of FIG. 3 in that the first bank BNL1_1 does not include the trench portions TP, and the holes H that expose the first insulating layer PAS1 are formed without the first bank BNL1_1 disposed therein. In the following description, redundant descriptions will be omitted, and the differences will be described.

The holes H of the display device 10_1 may be formed parallel to portions of the first bank BNL1_1 that extend in the second direction DR2 between the emission area EMA and the sub-region SA. For example, the holes H of the display device 10_1 include a first hole H1 and a second hole H2 disposed on the upper side (in the first direction DR1) of the emission area EMA between the emission area EMA and the sub-region SA of the corresponding sub-pixel PXn. The display device 10_1 may further include a third hole H3 disposed on the lower side (in the first direction DR1) of the emission area EMA between the emission area EMA and the sub-region SA of another sub-pixel PXn. Like the emission area EMA and the sub-region SA, the holes H may be substantially surrounded by the first bank BNL1_1. The emission area EMA may be connected to the sub-region SA through the holes H.

A first bridge bank portion BR1_1 (or bridge bank portion) of the first bank BNL1_1 may be disposed between the first hole H1 and the second hole H2. The first bridge bank portion BR1_1 (or bridge bank portion) may be spaced apart from the first bank portion BP1 of the first bank BNL1_1 in the second direction DR2, and may remain as a pattern which has a shape extending in the first direction DR1 between the emission area EMA and the sub-region SA.

Unlike the embodiment of FIG. 7, in the display device 10_1 according to an embodiment, the contact electrodes CNE may be disposed across the emission area EMA and the sub-region SA through the holes H. The contact electrodes CNE arranged in the holes H may be disposed directly on the first insulating layer PAS1 exposed by the holes H. As in the embodiment of FIG. 7, the first insulating layer PAS1 includes contact portions CT1, CT2, and CT3 in the sub-region SA and the contact electrodes CNE electrically contact the electrodes RME in the contact portions CT1, CT2, and CT3.

The first bank BNL1_1 may have a shape in which the portion thereof extending in the second direction DR2 is separated by the holes H between the emission area EMA and the sub-region SA. The first bank BNL1_1 may include the first bridge bank portion BR1_1 (or bridge bank portion) disposed between the holes H while surrounding the emission area EMA and the sub-region SA. This structure of the first bank BNL1_1 may be formed by a step of completely removing the remaining portions of the first bank layer BN1, after partially patterning the portions of the first bank layer BN1 when the openings OP of the second insulating layer PAS2 are formed, in the fabricating process of the display device 10_1.

Figure 18:
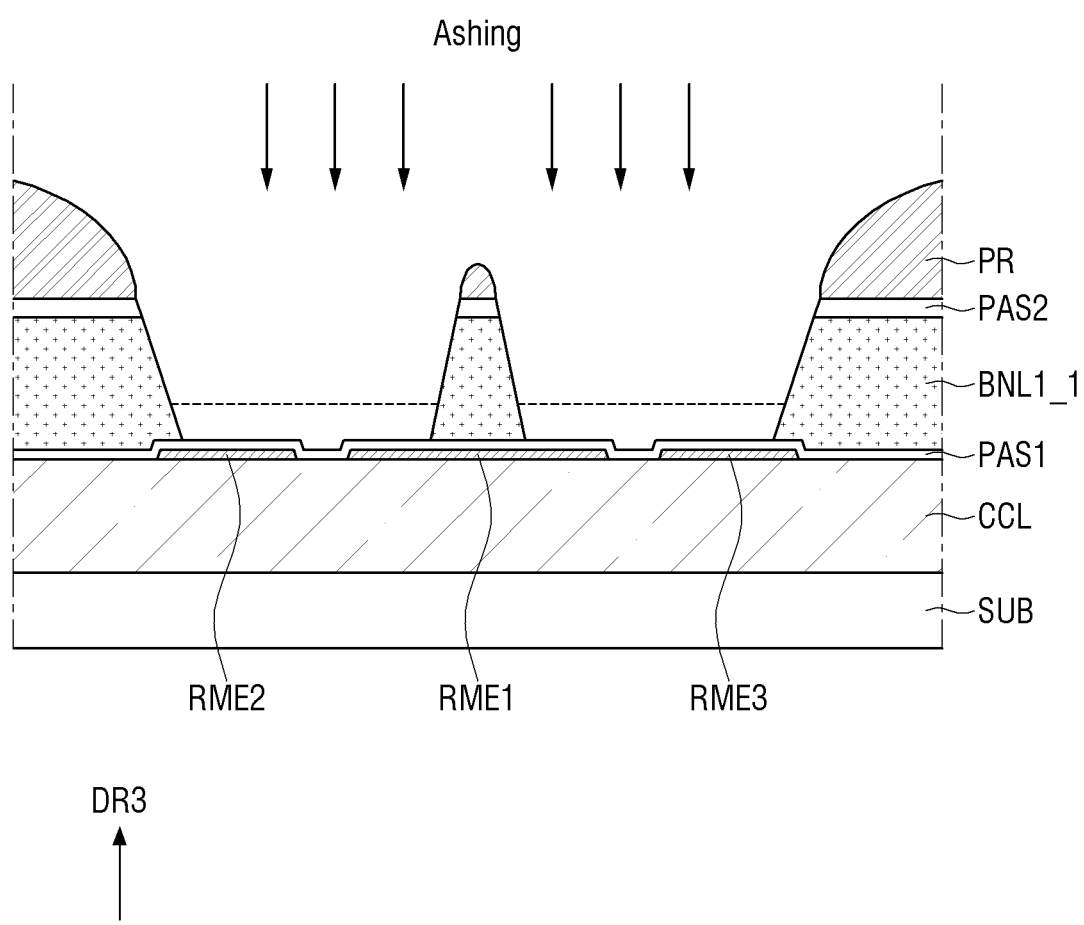
FIG. 18 is a schematic cross-sectional view illustrating a step in a fabricating process of the display device of FIG. 16.

FIG. 18 is a schematic cross-sectional view illustrating a step in a fabricating process of the display device of FIG. 16.

Referring to FIG. 18, during the fabricating process of the display device 10_1 according to an embodiment, a step of removing the exposed first bank layer BN1 may be further performed after the step of forming the second insulating layer PAS2. When the second insulating layer PAS2 is patterned, the first bank layer BN1 may be partially removed to form trench portions. When the trench portions of the first bank layer BN1 are completely removed by ashing, the holes H that connect the emission area EMA to the sub-region SA may be formed. Since the holes H of the display device 10_1 is also formed by etching the first bank layer BN1 together in the patterning step of the second insulating layer PAS2, the sidewall of the first bank BNL1_1 around the hole H may be aligned with the sidewall of the second insulating layer PAS2 disposed on the first bank BNL1_1. The second insulating layer PAS2 is not disposed in the holes H. Since the first insulating layer PAS1 and the second insulating layer PAS2 contain different materials, the first insulating layer PAS1 may not be removed even if the first bank layer BN1 is ashed. After ashing the first bank layer BN1 to form the holes H, the contact electrodes CNE are formed on the exposed first insulating layer PAS1 to fabricate the display device 10_1 of FIGS. 16 and 17.

Figure 19:
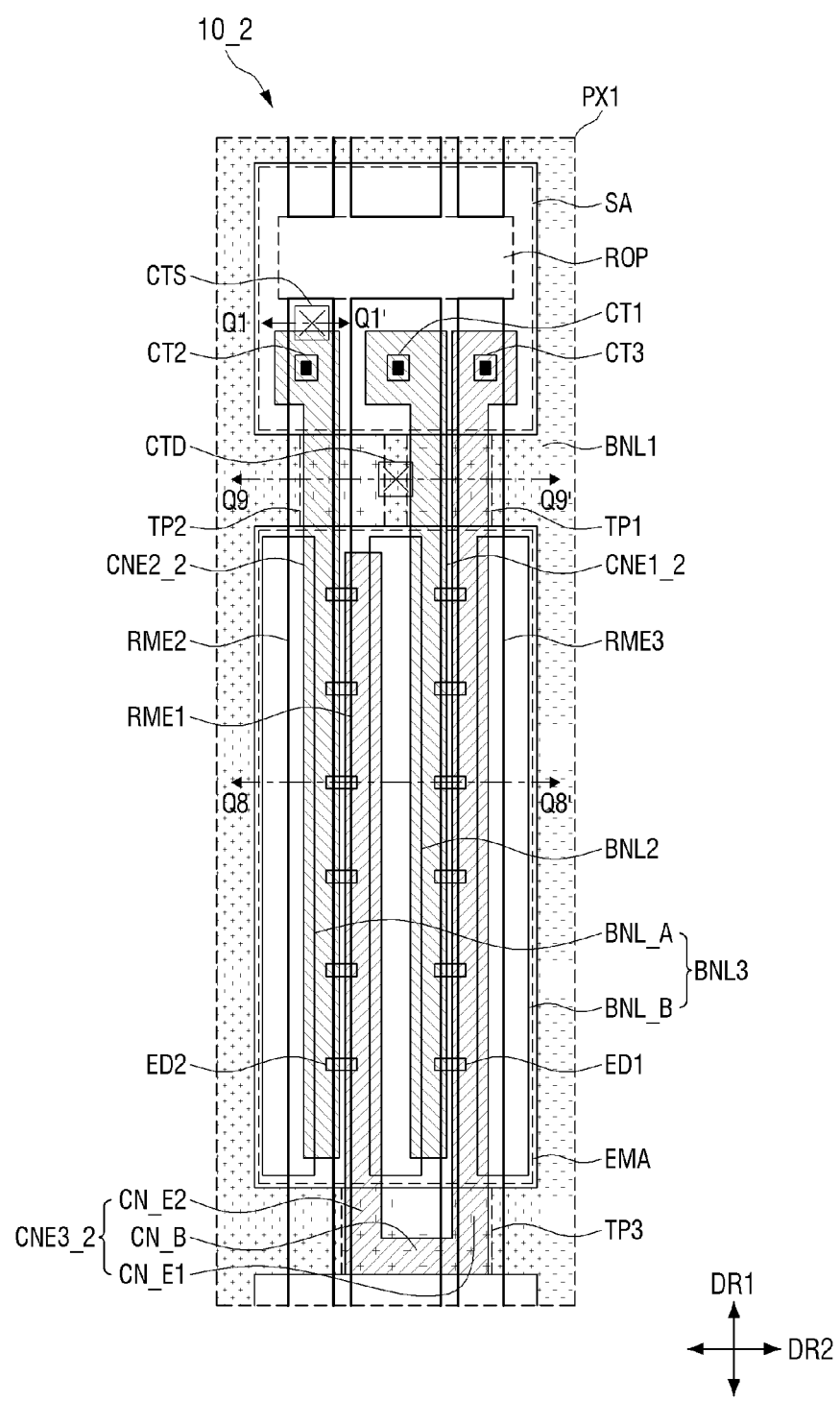
FIG. 19 is a schematic plan view illustrating a sub-pixel of a display device according to an embodiment.
Figure 20:
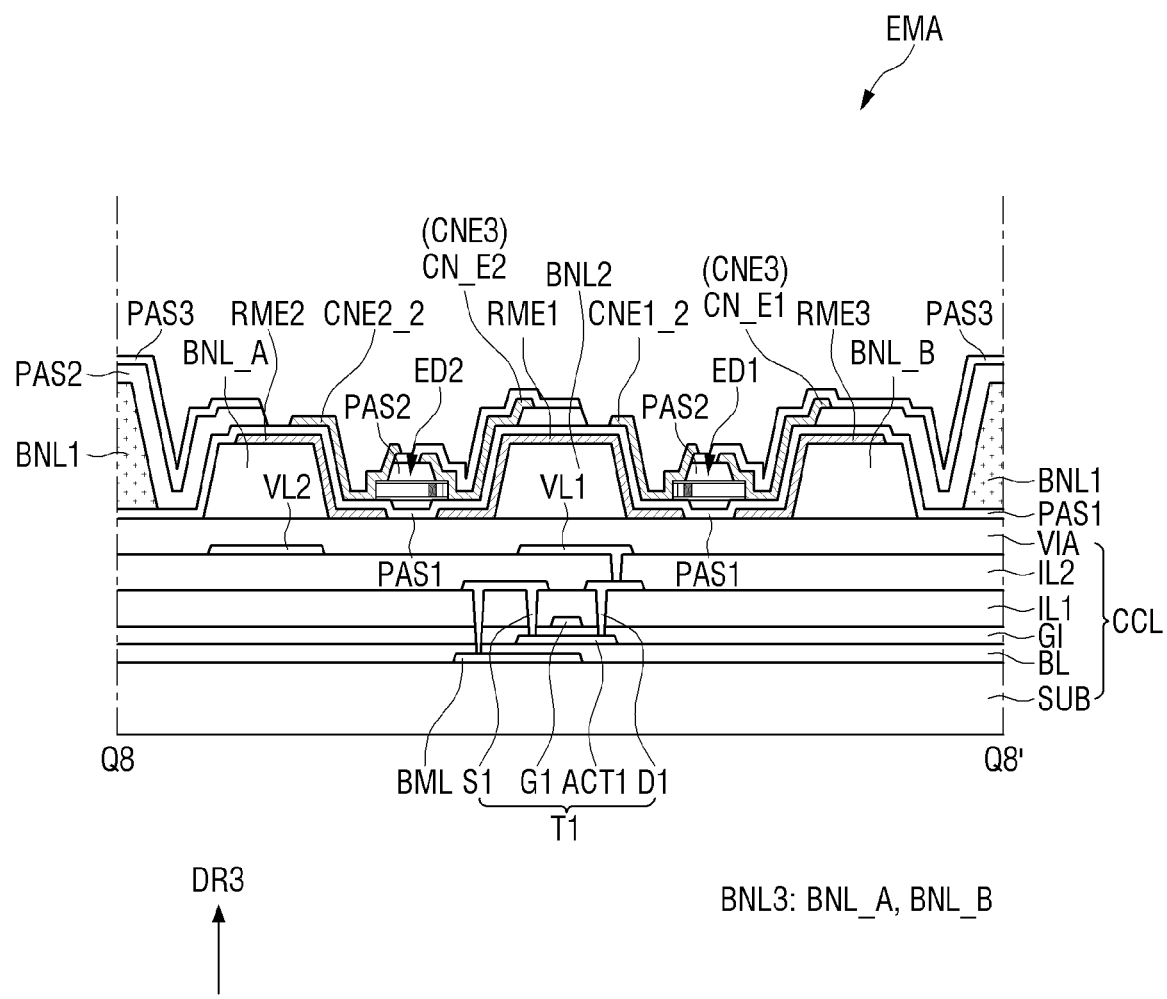
FIG. 20 is a schematic cross-sectional view taken along line Q8-Q8' of FIG. 19.
Figure 21:
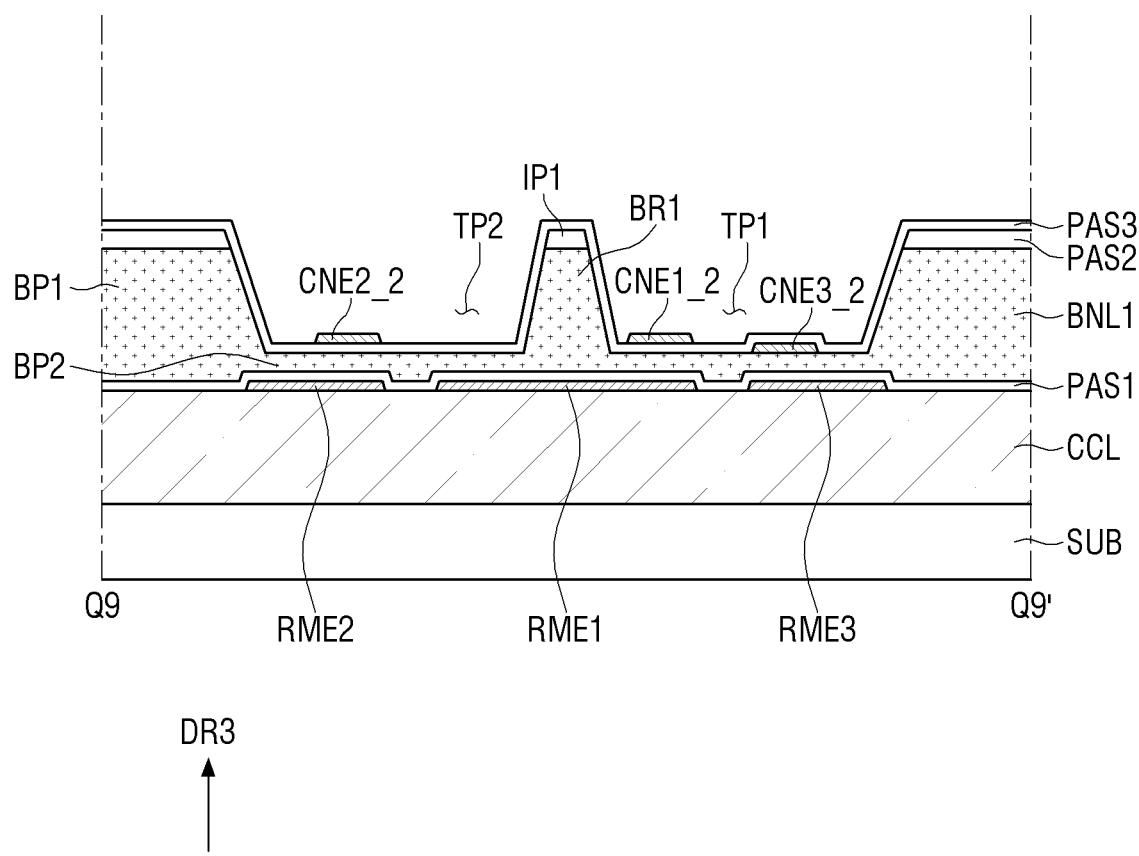
FIG. 21 is a schematic cross-sectional view taken along line Q9-Q9' of FIG. 19.

FIG. 19 is a schematic plan view illustrating a sub-pixel of a display device according to an embodiment. FIG. 20 is a schematic cross-sectional view taken along line Q8-Q8' of FIG. 19. FIG. 21 is a schematic cross-sectional view taken along line Q9-Q9' of FIG. 19.

Referring to FIGS. 19 to 21, a display device 10_2 according to an embodiment may further include a third insulating layer PAS3. The third insulating layer PAS3 may be disposed on a third contact electrode CNE3_2 and the second insulating layer PAS2, and a first contact electrode CNE1_2 and a second contact electrode CNE2_2 may be arranged on the third insulating layer PAS3. The third insulating layer PAS3 may insulate the first contact electrode CNE1_2 and the second contact electrode CNE2_2 from the third contact electrode CNE3_2 in order to prevent direct contact therebetween.

In an embodiment, the third insulating layer PAS3 may be disposed on the trench portion TP of the first bank BNL1 as well as the second insulating layer PAS2. In the trench portion TP of the first bank BNL1, the third insulating layer PAS3 may be disposed directly on the first bank BNL1 exposed by the opening OP of the second insulating layer PAS2, and may cover the side surfaces of the first bridge bank portion BR1 (or bridge bank portion) and the first bridge pattern IP1.

The third contact electrode CNE3_2 may be disposed directly on the second bank portion BP2 of the first bank BNL1 in the first trench portion TP1, and may be covered by the third insulating layer PAS3 disposed thereon. The third contact electrode CNE3_2 may be disposed between the first bank BNL1 and the third insulating layer PAS3 in the first trench portion TP1. The first contact electrode CNE1_2 and the second contact electrode CNE2_2 may be disposed directly on the third insulating layer PAS3 in the first trench portion TP1 and the second trench portion TP2, respectively. Thus, the first contact electrode CNE1_2 and the second contact electrode CNE2_2 may be directly disposed on the third insulating layer PAS3 in the second bank portion BP2. The embodiment is characterized in that the display device 10_2 further includes the third insulating layer PAS3, and thus the first contact electrode CNE1_2 and the second contact electrode CNE2_2 are arranged on the different layer from the third contact electrode CNE3_2.

Embodiments have been disclosed herein, and although terms are employed, they are used and are to be interpreted in a generic and descriptive sense only and not for purpose of limitation. In some instances, as would be apparent by one of ordinary skill in the art, features, characteristics, and/or elements described in connection with an embodiment may be used singly or in combination with features, characteristics, and/or elements described in connection with other embodiments unless otherwise specifically indicated. Accordingly, it will be understood by those of ordinary skill in the art that various changes in form and details may be made without departing from the spirit and scope of the disclosure as set forth in the following claims.

What is claimed is:

1. A display device comprising:
an emission area and a sub-region spaced apart from the emission area in a first direction;
electrodes extending in the first direction, disposed across the emission area and the sub-region, and spaced apart from each other in a second direction;
a first bank surrounding the emission area and the sub-region; and
light emitting elements disposed on the electrodes spaced apart in the second direction in the emission area,
wherein the first bank includes trench portions in which a top surface of the first bank is partially depressed, the trench portions being disposed between the emission area and the sub-region.

2. The display device of claim 1, further comprising contact electrodes disposed on the electrodes and extending in the first direction,
wherein the contact electrodes are disposed across the emission area and the sub-region through the trench portions of the first bank.

3. The display device of claim 2, wherein the first bank includes:
a first bank portion;
a second bank portion including the trench portions, the second bank portion having a height lower than a height of the first bank portion; and
a bridge bank portion disposed between the trench portions and having a same height as the height of the first bank portion.

4. The display device of claim 2, further comprising a first insulating layer covering the electrodes,
wherein the first insulating layer includes contact portions partially exposing top surfaces of the electrodes in the sub-region.

5. The display device of claim 4, wherein the contact electrodes electrically contact the light emitting elements disposed in the emission area, and electrically contact the electrodes exposed through the contact portions in the sub-region.

6. The display device of claim 4, further comprising a second insulating layer disposed on the first insulating layer, the first bank, and the light emitting elements, wherein
the second insulating layer exposes ends of the light emitting elements, and
the second insulating layer is not disposed in the trench portions of the first bank.

7. The display device of claim 6, wherein the contact electrodes are disposed on the second insulating layer, and are directly disposed on the second bank portion in the trench portions.

8. The display device of claim 6, wherein each of the trench portions of the first bank has a sidewall aligned with a sidewall of the second insulating layer disposed on the first bank.

9. The display device of claim 6, wherein
the second insulating layer includes openings adjacent to the trench portions in the emission area and exposing a top surface of the first insulating layer, and
the contact electrodes are directly disposed on the first insulating layer in the openings.

10. The display device of claim 6, further comprising a third insulating layer disposed on at least one of the contact electrodes and the second insulating layer,
wherein at least a portion of the contact electrodes is directly disposed on the third insulating layer in the second bank portion.

11. The display device of claim 10, wherein at least a portion of the contact electrodes is disposed between the first bank and the third insulating layer in the trench portions.

12. The display device of claim 1, wherein
the electrodes include a first electrode and a second electrode spaced apart from the first electrode in the second direction, the display device further includes:
- a first contact electrode disposed on the first electrode and extending in the first direction; and
- a second contact electrode disposed on the second electrode and extending in the first direction, and the trench portions include:
- a first trench portion in which the first contact electrode is disposed; and
- a second trench portion in which the second contact electrode is disposed, the second trench portion being spaced apart from the first trench portion in the second direction.

13. The display device of claim 12, wherein
the electrodes further include a third electrode spaced apart from the second electrode in the second direction, the first electrode being disposed between the second electrode and the third electrode, and
the light emitting elements include:
- a first light emitting element having a first end disposed on the first electrode, and a second end disposed on the third electrode; and
- a second light emitting element having a first end disposed on the first electrode, and a second end disposed on the second electrode.

14. The display device of claim 13, further comprising a third contact electrode including:
- a first extension portion disposed on the third electrode and electrically contact the second end of the first light emitting element;
- a second extension portion disposed on the first electrode and electrically contact the first end of the second light emitting element; and
- a connection portion connecting the first extension portion to the second extension portion,
wherein the first extension portion extends in the first direction and is disposed across the emission area and the sub-region through the first trench portion.

15. The display device of claim 14, wherein
the trench portions further include a third trench portion located opposite the first trench portion in the first direction with respect to the emission area, and the connection portion is disposed on the third trench portion.

16. A display device comprising:
an emission area and a sub-region spaced apart from the emission area in a first direction;
holes disposed between the emission area and the sub-region;
electrodes extending in the first direction, disposed across the emission area and the sub-region, and spaced apart from each other in a second direction;
a first bank surrounding the emission area and the sub-region and including a bridge bank portion disposed between the holes;
light emitting elements disposed on the electrodes spaced apart in the second direction in the emission area; and
a contact electrodes disposed on the electrodes and extending in the first direction, wherein
the holes connect the emission area to the sub-region, and
the contact electrodes are disposed across the emission area and the sub-region through the holes.

17. The display device of claim 16, further comprising:
a first insulating layer covering the electrodes; and
a second insulating layer disposed on the first insulating layer, the first bank, and the light emitting elements to expose ends of the light emitting elements,
wherein the second insulating layer is not disposed in the holes.

18. The display device of claim 17, wherein the contact electrodes are disposed on the second insulating layer that electrically contacts the light emitting elements, and are directly disposed on the first insulating layer in the holes.

19. The display device of claim 17, wherein
the first insulating layer includes contact portions formed in the sub-region to partially expose top surfaces of the electrodes, and
the contact electrodes electrically contact the electrodes in the contact portions of the sub-region.

20. The display device of claim 17, wherein a sidewall of the first bank around the holes is aligned with a sidewall of the second insulating layer disposed on the first bank.

* * * * *